United States Patent
Wu et al.

(10) Patent No.: US 12,538,547 B2
(45) Date of Patent: Jan. 27, 2026

(54) FIN JOG STRUCTURE AND METHODS OF MAKING SAME

(71) Applicant: Taiwan Semiconductor Manufacturing Company, Ltd., Hsin-Chu (TW)

(72) Inventors: Wei-Hao Wu, Hsinchu (TW); Chung-Cheng Chien, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 376 days.

(21) Appl. No.: 18/326,214

(22) Filed: May 31, 2023

(65) Prior Publication Data
US 2024/0405097 A1 Dec. 5, 2024

(51) Int. Cl.
*H10D 64/01* (2025.01)
*H10D 30/01* (2025.01)
*H10D 30/62* (2025.01)
*H10D 84/01* (2025.01)
*H10D 84/03* (2025.01)
*H10D 84/85* (2025.01)

(52) U.S. Cl.
CPC ......... *H10D 64/017* (2025.01); *H10D 30/024* (2025.01); *H10D 30/6211* (2025.01); *H10D 64/021* (2025.01); *H10D 84/017* (2025.01); *H10D 84/0184* (2025.01); *H10D 84/0193* (2025.01); *H10D 84/038* (2025.01); *H10D 84/853* (2025.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |

(Continued)

FOREIGN PATENT DOCUMENTS

TW 202015178 A 4/2020

*Primary Examiner* — Khaja Ahmad
(74) *Attorney, Agent, or Firm* — HAYNES AND BOONE, LLP

(57) ABSTRACT

A method includes providing a workpiece. The workpiece includes a substrate, a fin protruding from the substrate, and a dummy gate structure over the fin. The method further includes performing an oxidizing process to exposed surfaces of the fin and the dummy gate structure to form an oxide layer thereon, removing the oxide layer to expose an unoxidized top surface and sidewalls of the fin and unoxidized sidewalls of the dummy gate structure, epitaxially growing a cap layer on the unoxidized top surface and sidewalls of the fin and the unoxidized sidewalls of the dummy gate structure, forming a source/drain feature on the fin, and replacing the dummy gate structure with a metal gate structure.

20 Claims, 27 Drawing Sheets

(56) References Cited

U.S. PATENT DOCUMENTS

| | | | |
|---|---|---|---|
| 2020/0303258 A1* | 9/2020 | Chiang | H10D 30/797 |
| 2021/0367053 A1* | 11/2021 | Chung | H10D 30/6735 |
| 2021/0384034 A1* | 12/2021 | Lian | H10D 64/017 |
| 2021/0408266 A1* | 12/2021 | Sie | H10D 84/0188 |
| 2022/0302316 A1* | 9/2022 | Shin | H10D 30/43 |

* cited by examiner

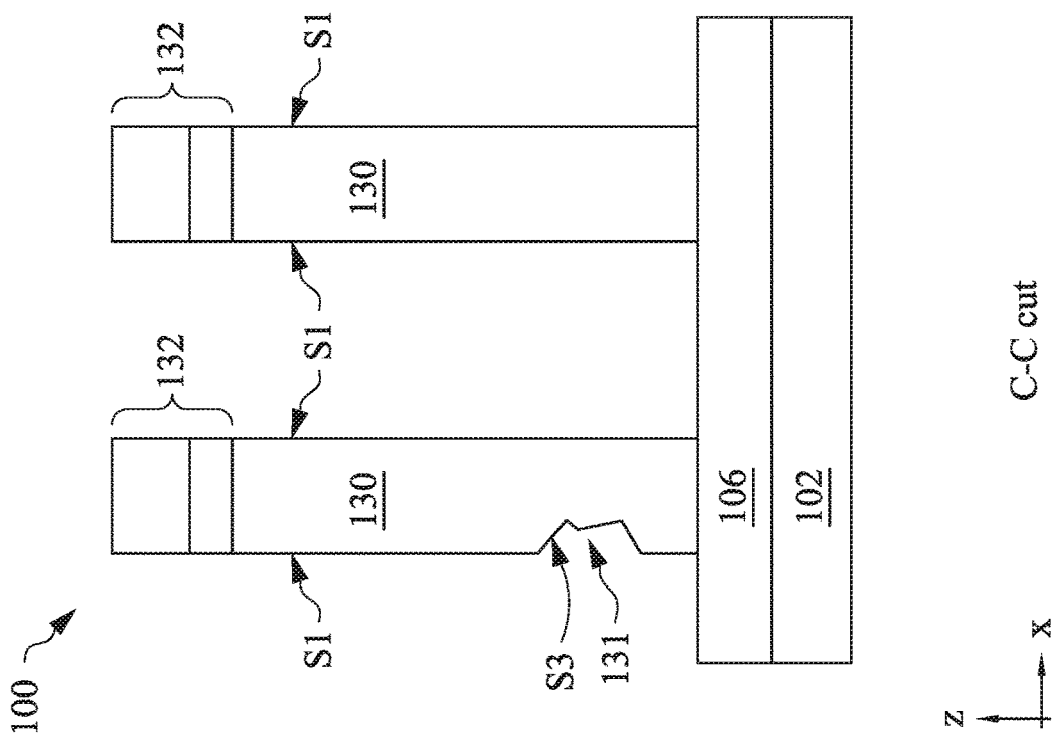
FIG. 3C C-C cut
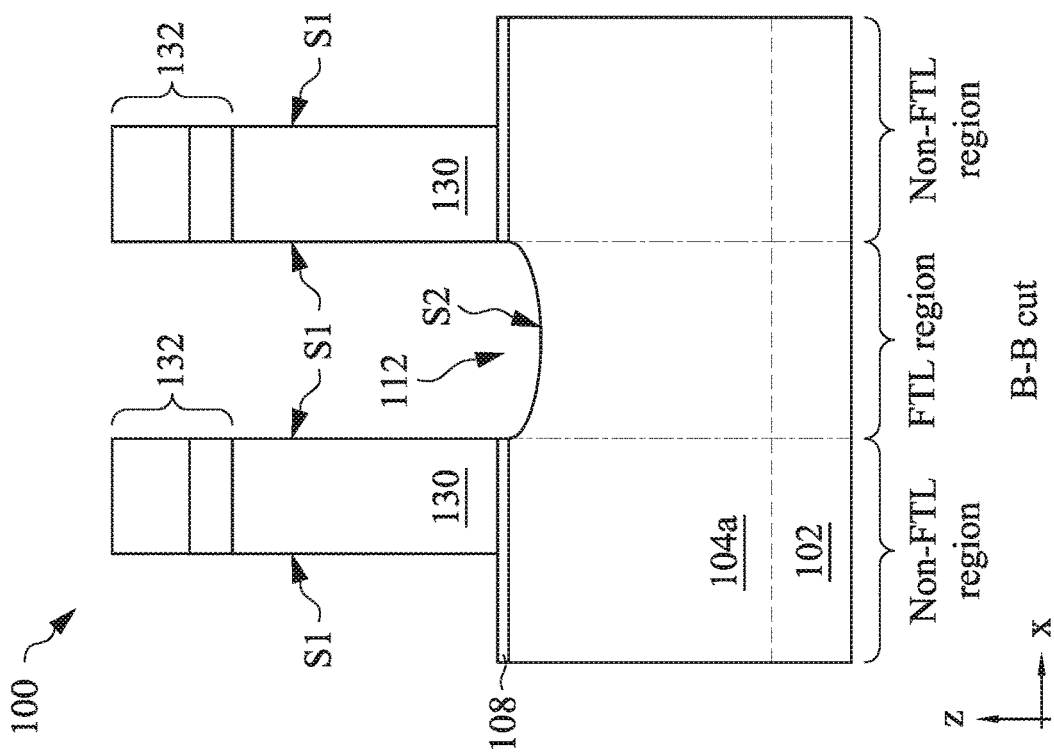
FIG. 3B B-B cut

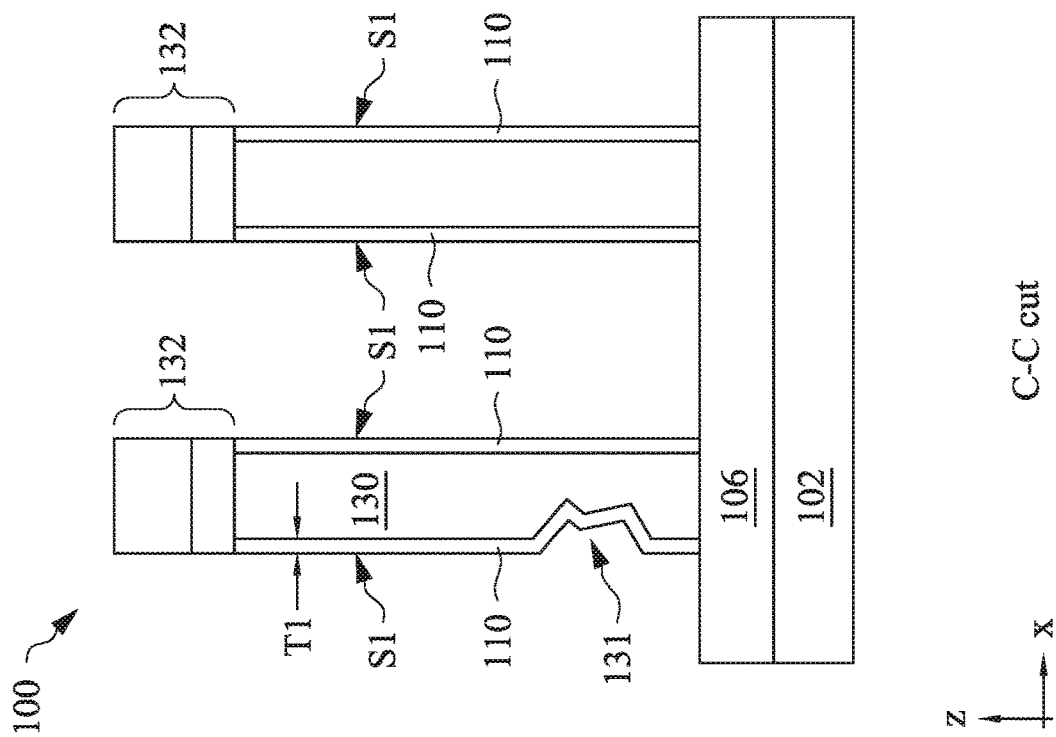
FIG. 4C C-C cut
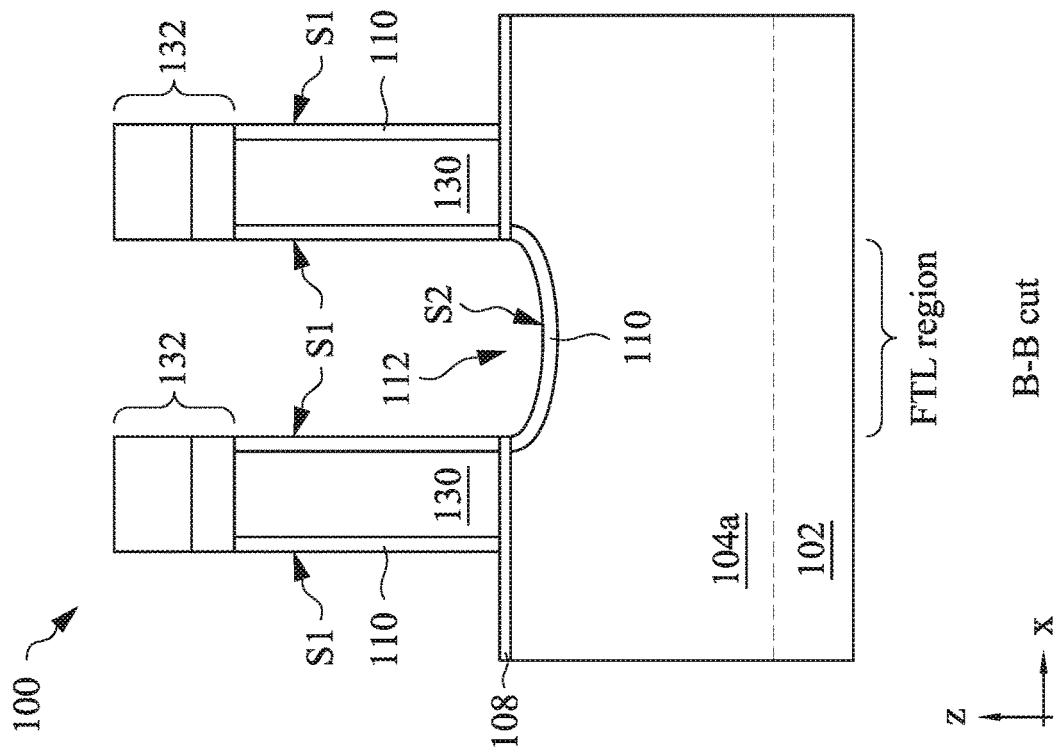
FIG. 4B B-B cut

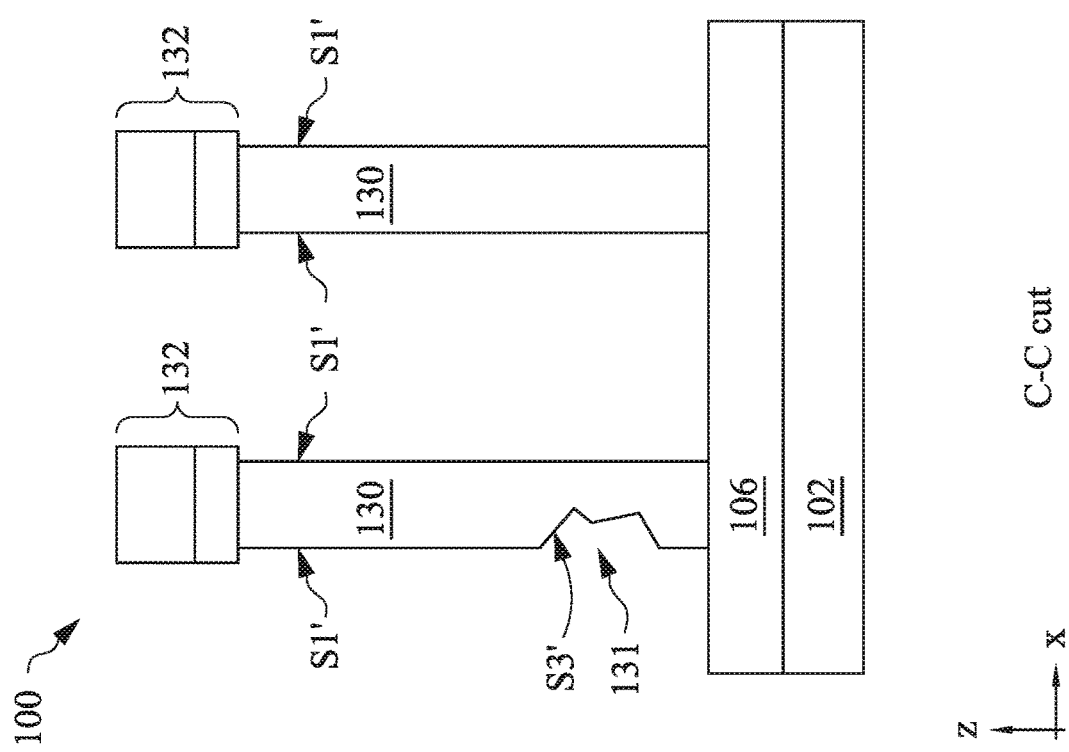
FIG. 5C  C-C cut
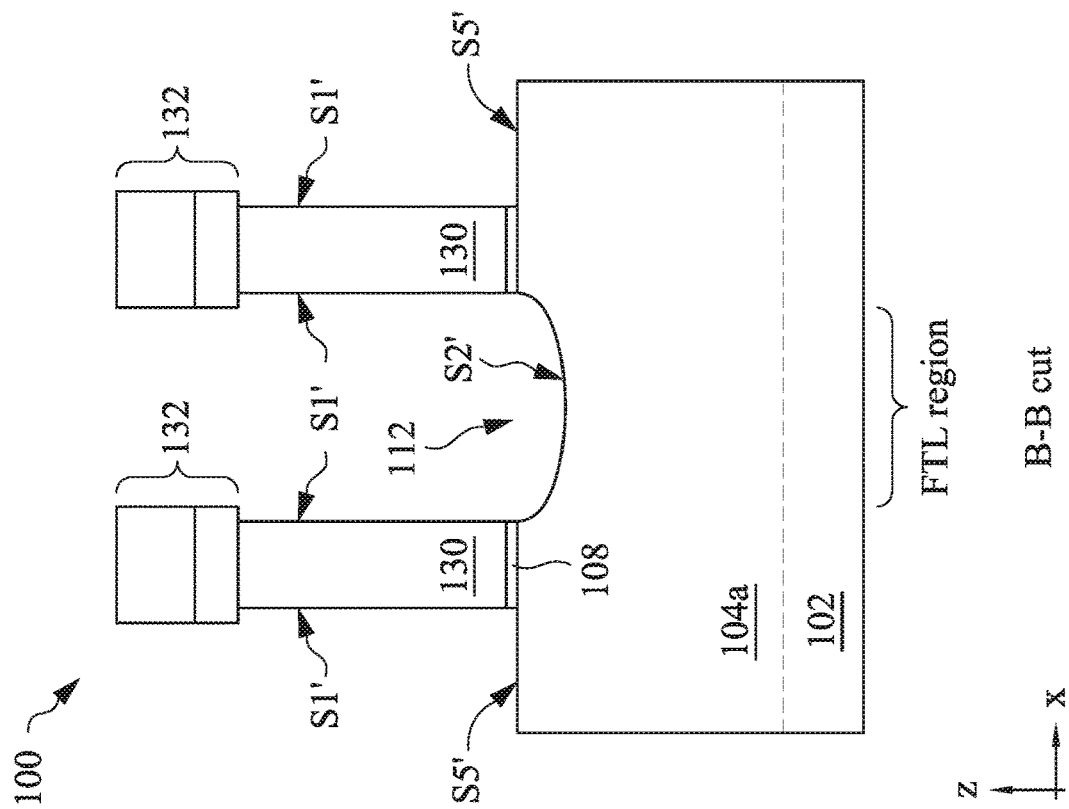
FIG. 5B  B-B cut

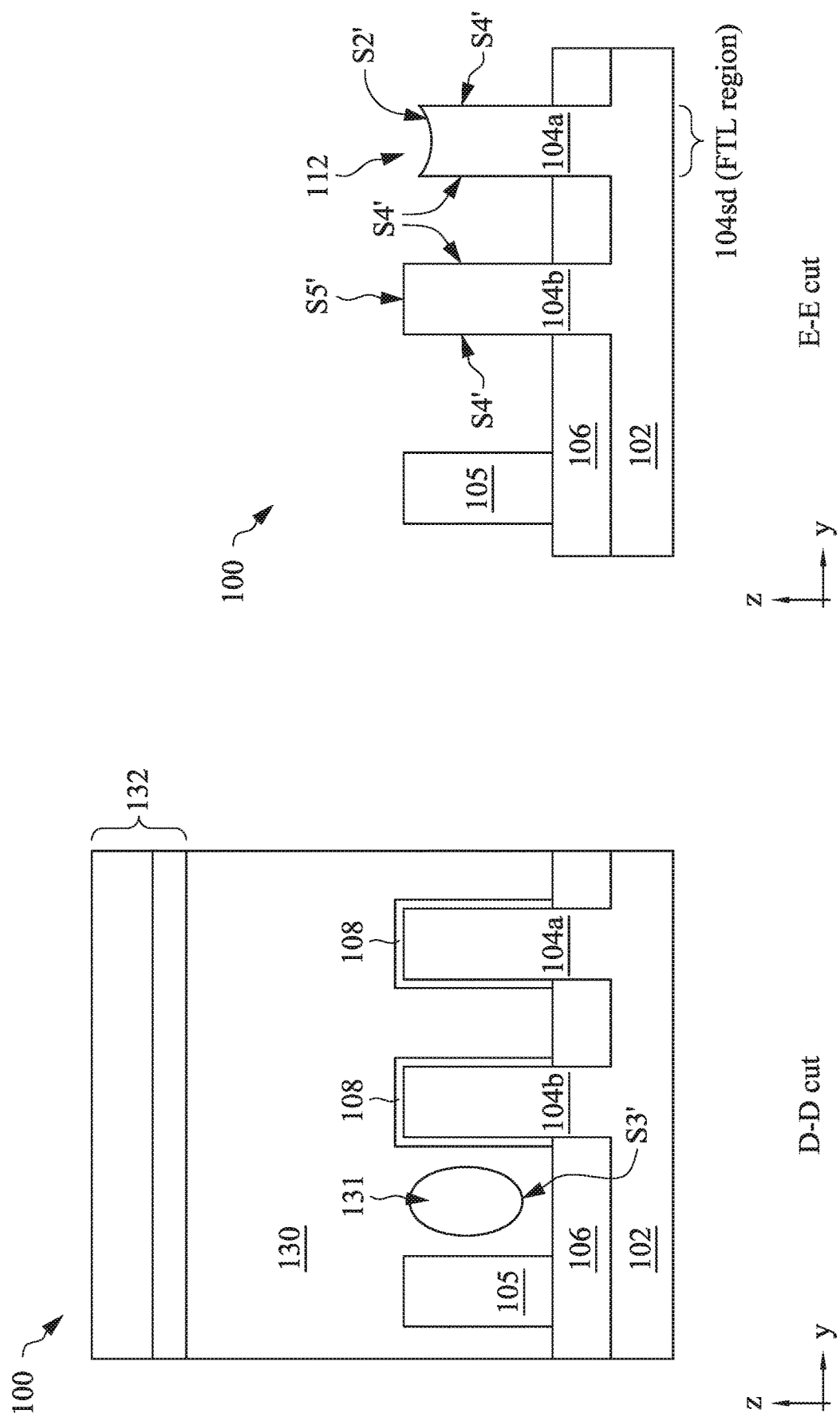

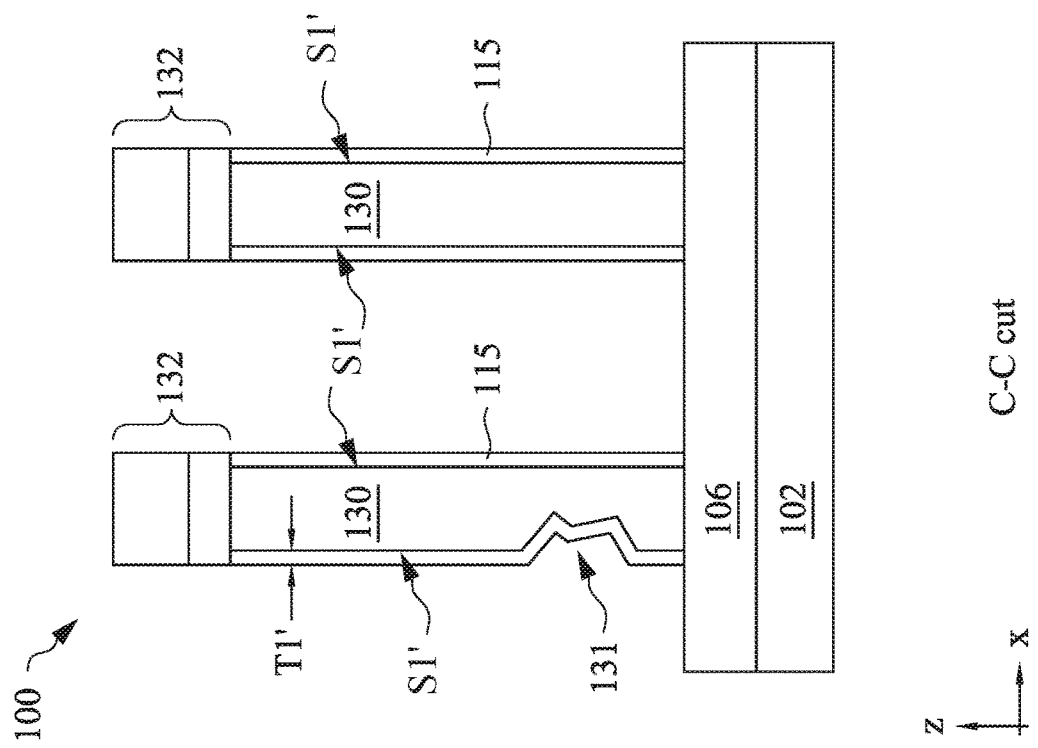
FIG. 6C  C-C cut
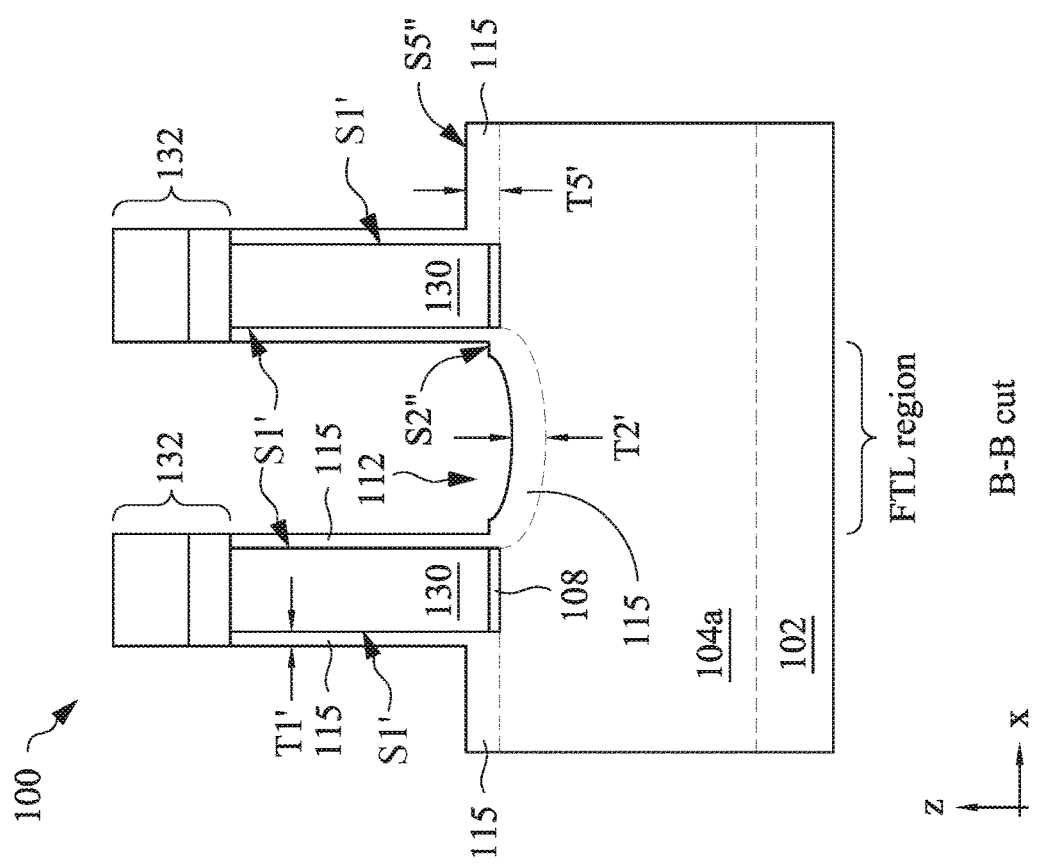
FIG. 6B  B-B cut

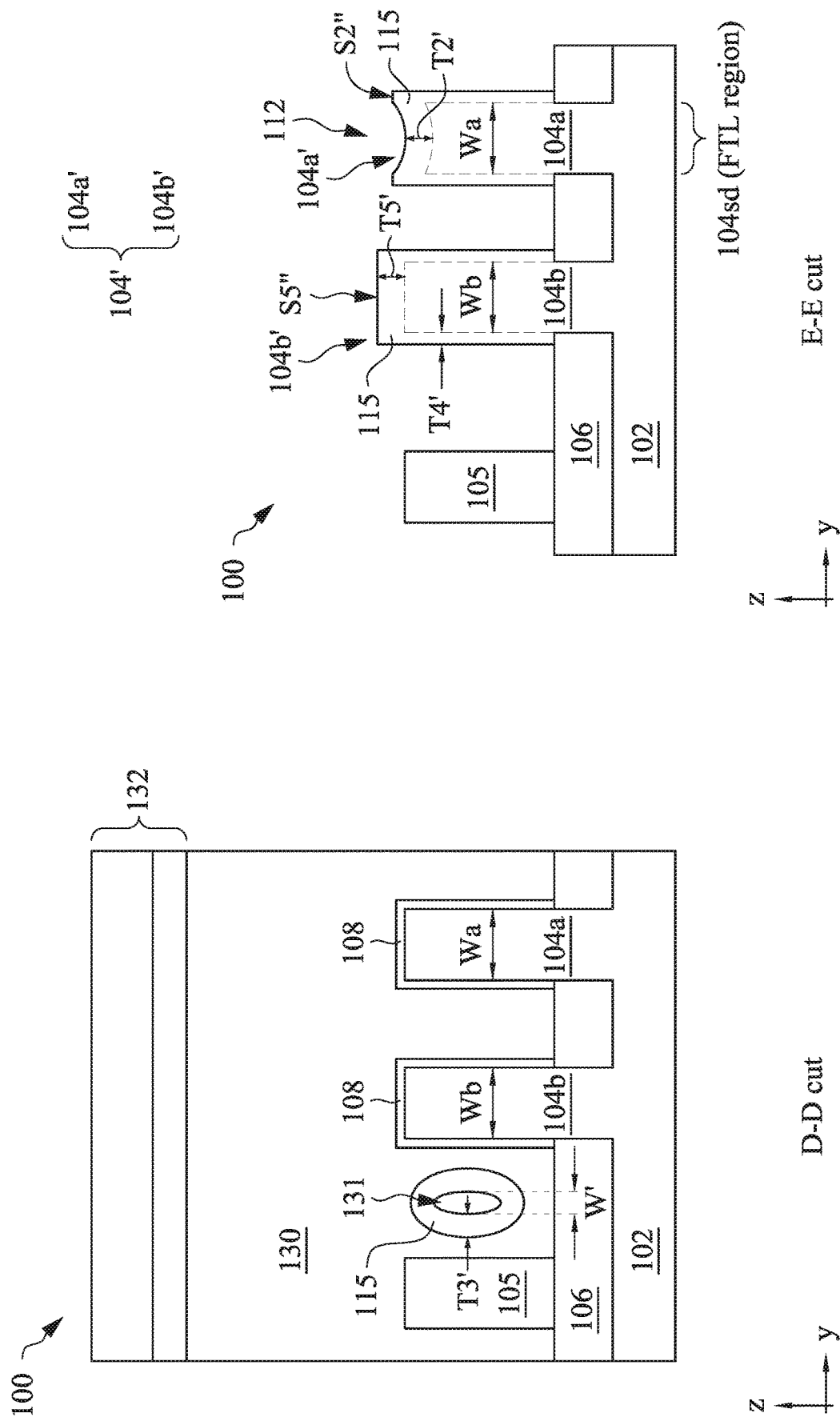
FIG. 6E  E-E cut
FIG. 6D  D-D cut

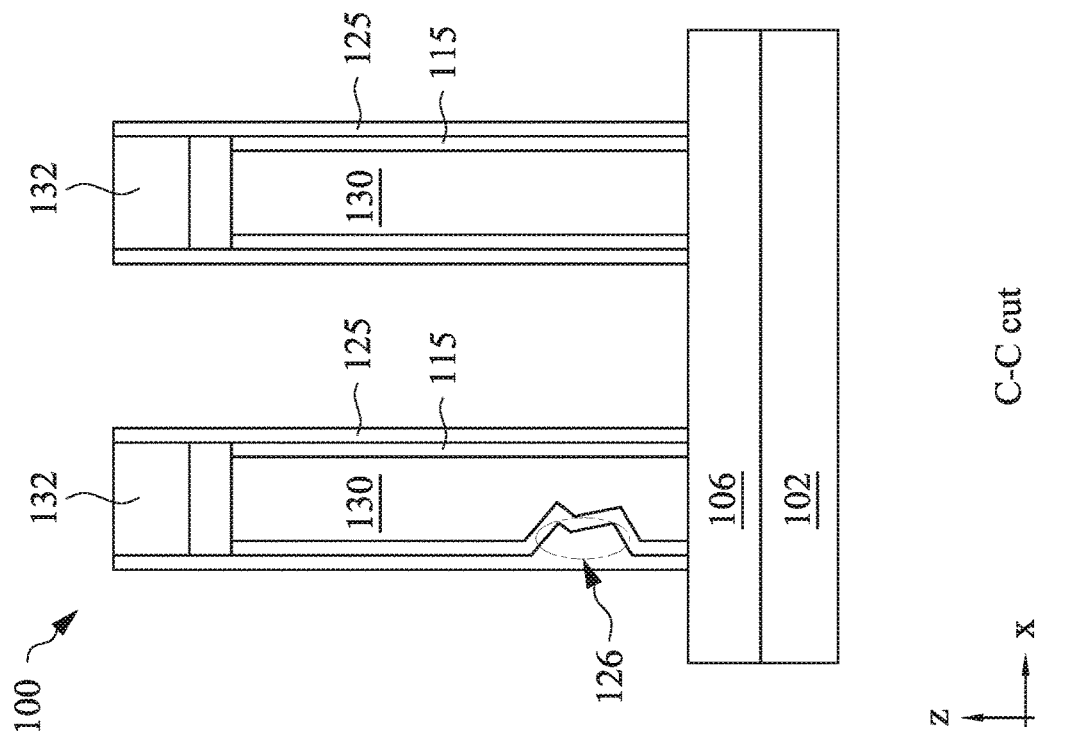
FIG. 7C  C-C cut
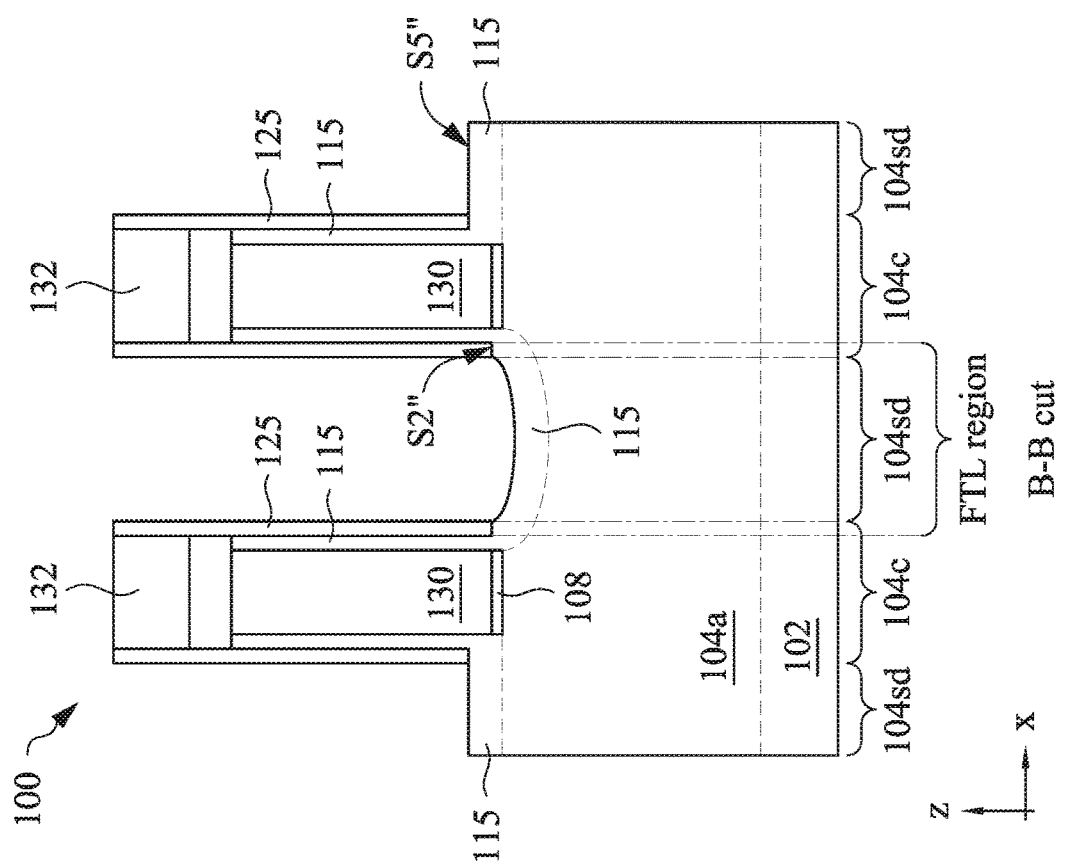
FIG. 7B  B-B cut

E-E cut

D-D cut

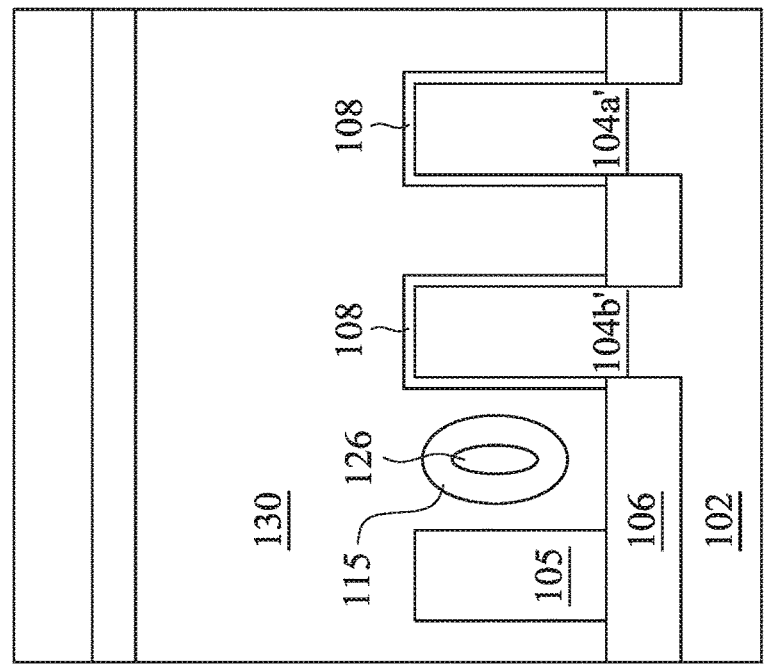
FIG. 8D D-D cut
FIG. 8E E-E cut

E-E cut

D-D cut

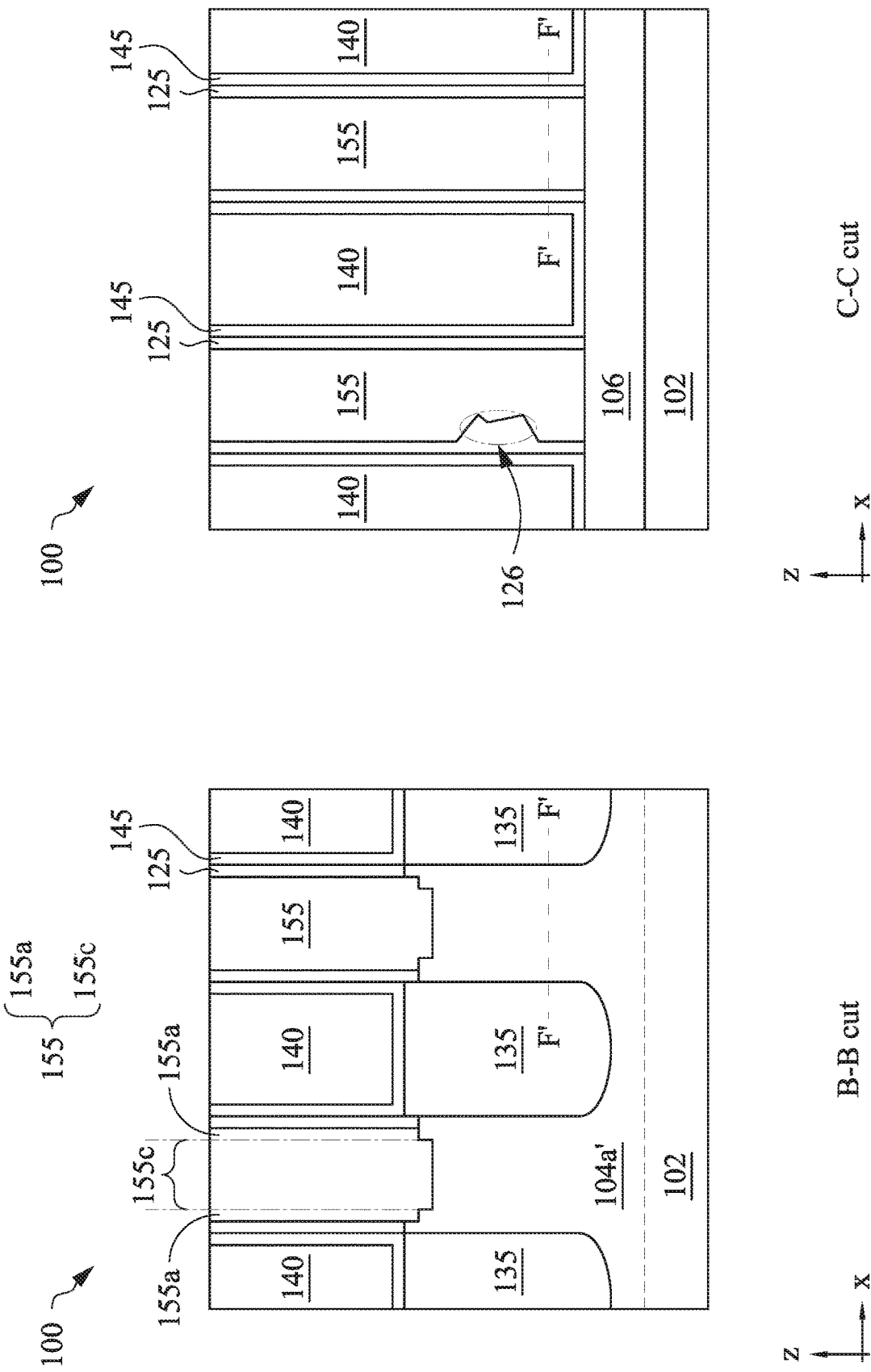

FIN JOG STRUCTURE AND METHODS OF MAKING SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As the geometry size of IC devices decreases, in some IC designs, such as Field-Effect Transistors (FETs) designs, a gate formation process under the ever-decreasing gate critical dimensions (CDs) and gate pitches may also introduce footing profile, voids in the polysilicon gate, and excessive fin top loss, which may yield defects in IC devices and may impact the overall performance of the IC devices. While existing IC designs and fabricating methods are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3B, 4B, 5B, 6B, 7B, 8B, 9B, and 10B illustrate fragmentary cross-sectional views of the workpiece during various fabrication stages in the method of FIG. 1 along line B-B of FIGS. 3A, 4A, 5A, 6A, 7A, 8A, 9A, and 10A, respectively, according to various aspects of the present disclosure.

FIGS. 3C, 4C, 5C, 6C, 7C, 8C, 9C, and 10C illustrate fragmentary cross-sectional views of the workpiece during various fabrication stages in the method of FIG. 1 along line C-C of FIGS. 3A, 4A, 5A, 6A, 7A, 8A, 9A, and 10A, respectively, according to various aspects of the present disclosure.

FIGS. 3D, 4D, 5D, 6D, 7D, 8D, 9D, and 10D illustrate fragmentary cross-sectional views of the workpiece during various fabrication stages in the method of FIG. 1 along line D-D of FIGS. 3A, 4A, 5A, 6A, 7A, 8A, 9A, and 10A, respectively, according to various aspects of the present disclosure.

FIGS. 3E, 4E, 5E, 6E, 7E, 8E, 9E, and 10E illustrate fragmentary cross-sectional views of the workpiece during various fabrication stages in the method of FIG. 1 along line E-E of FIGS. 3A, 4A, 5A, 6A, 7A, 8A, 9A, and 10A, respectively, according to various aspects of the present disclosure.

DETAILED DESCRIPTION

Figure 1:
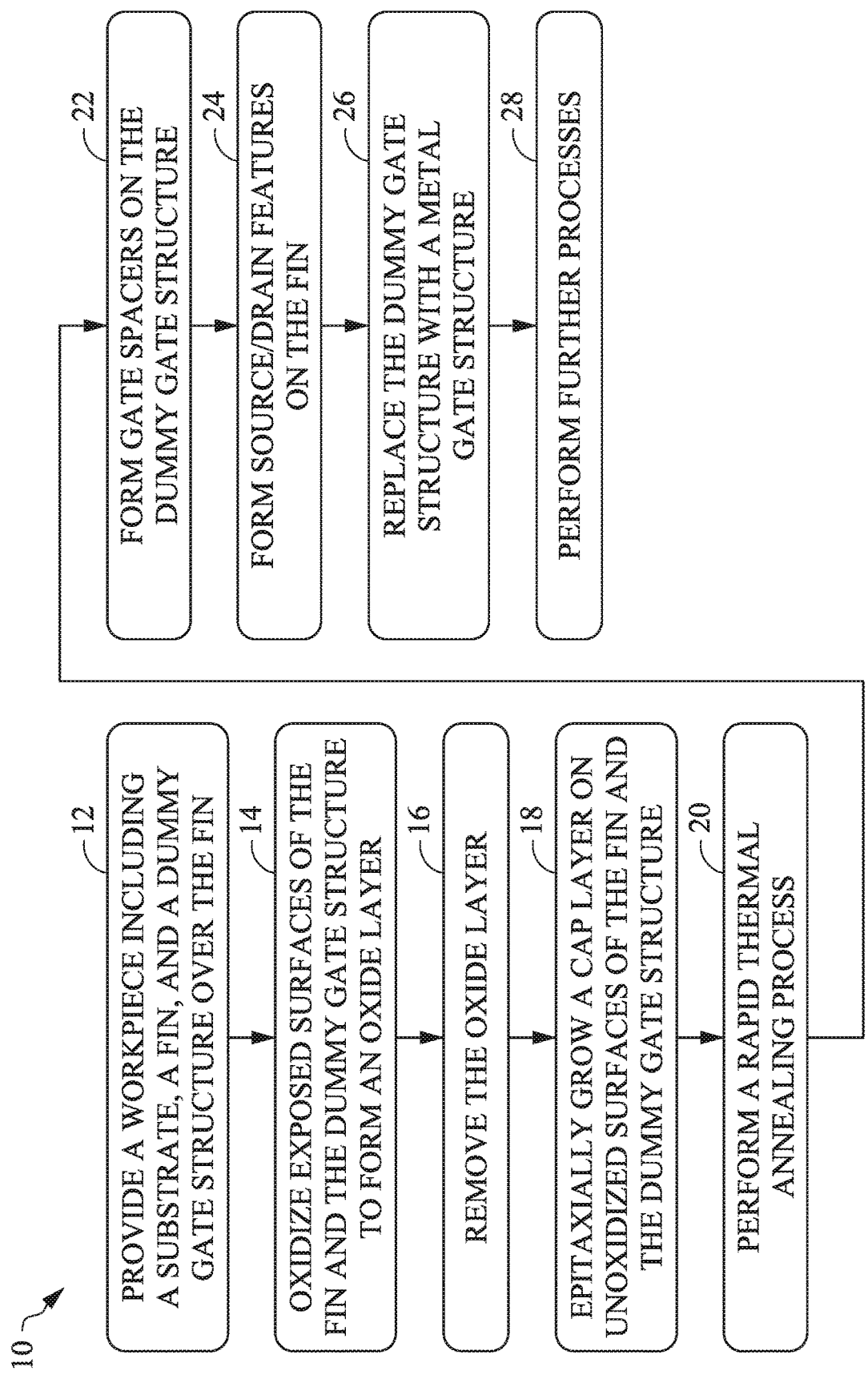
FIG. 1 illustrates a flow chart of a method for forming a semiconductor structure, according to one or more aspects of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below." "lower." "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a metal gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a metal gate structure that can extend, partially or fully, around a channel region to provide access to the channel region on two or more sides. Because its metal gate structure surrounds the channel region, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given MBC transistor alternative names such as a nanosheet transistor or a nanowire transistor. Variants of MBC transistors, such as those referred to as fish-bone structures or forksheet structures, have been proposed to reduce cell dimensions. In a forksheet structure, adjacent stacks of channel members may be divided by a dielectric wall (also referred to as a dielectric fin). The dielectric wall usually has a height substantially equal to or greater than that of the topmost channel members or that of the source/drain features. Complementary metal-oxide-semiconductor field effect transistors (CMOS FETs) have dominated the semiconductor industry due to their high noise immunity and low static power consumption. A CMOS FET includes an n-type FET (NFET) and a p-type FET (PFET) disposed side-by-side on the same substrate and the NFET and PFET share the same structure. In some embodiments, NFET and the PFET are both planar devices, both FinFETs, or both MBC transistors.

A semiconductor structure may have dummy gates formed over fin structures. The dummy gates may be polysilicon gate structures, which will be replaced by gate stacks, such as high-k metal gate stacks, in a gate-last process. The dummy gates may be formed by various process steps such as layer deposition, patterning, etching, as well as other suitable processing steps. When forming the dummy gates, top portions of the fin structures not covered by the dummy gates may be etched, causing fin top loss, which may impact the overall performance of the semiconductor device and lower the device yield. In addition, the dummy gates at the bottom intersecting the fin structures may have a footing portion, also referred to as corner residue. Corner residue refers to residue (or byproducts) remaining at a corner of intersecting junctions where the dummy gate structure, the fin structure, and a top surface of the substrate meet (top portions of the substrate may include isolation features, as will be explained in further details below). The residue accumulated in the corner results in gate length non-uniformity along the height of the dummy gate structure. When the dummy gate is replaced with a metal gate in the gate-last process, the metal gate will inherit this gate length non-uniformity and have a protrusion profile (i.e., larger gate length) at the corner, termed as "protruding corner." The non-uniformity affects many operating parameters of devices, such as speed performance and power consumption. There is also a concern that the protrusion profile aggravates may cause electrical short between the gate stacks and source/drain features formed after the dummy gates and may cause device shorting caused by metal material leakage from a protruding corner during the gate-last process, also known as "metal gate protrusion." Further, layer deposition may form voids in the dummy gates. When forming gate spacers over sidewalls of the dummy gates, the gate spacers may be formed inside the voids. Subsequently, when the dummy gates are replaced by gate stacks, the portion of the gate spacers inside the voids remain, which results in defect gate stacks.

The present disclosure is generally related to semiconductor structures and fabrication methods. More particularly, the present disclosure is related to a semiconductor structure including a fin, a gate structure over the fin, and gate spacers on sidewalls of the gate structure. A portion of the fin directly under the gate spacers has a height and a width greater than those of a portion of the fin directly under the gate structure. A method of making the semiconductor structure involves oxidizing surfaces of a dummy gate structure and exposed surfaces of a fin to form an oxide layer, removing the oxide layer, and epitaxially growing a cap layer therein. A footing portion of the dummy gate structure may be oxidized to form a portion of the oxide layer and removed thereafter. The cap layer may enlarge the fin uncovered by the dummy gate structure and reduce sizes of any void in the dummy gate structure.

The various aspects of the present disclosure will now be described in more detail with reference to the figures. In that regard, FIG. 1 is a flowchart illustrating method 10 of forming a semiconductor structure according to embodiments of the present disclosure. Method 10 is described below in conjunction with FIGS. 2-10F, which are fragmentary perspective, top, or cross-sectional views of a workpiece 100 at different stages of fabrication according to embodiments of method 10. Method 10 is merely an example and is not intended to limit the present disclosure to what is explicitly illustrated therein. Additional steps may be provided before, during and after the method 10, and some steps described can be replaced, eliminated, or moved around for additional embodiments of the method. Not all steps are described herein in detail for reasons of simplicity. Because the workpiece 100 will be fabricated into a semiconductor structure upon conclusion of the fabrication processes, the workpiece 100 may be referred to as the semiconductor structure 100 as the context requires. For avoidance of doubts, the X, Y and Z directions in FIGS. 2-10F are perpendicular to one another and are used consistently throughout the present disclosure. Throughout the present disclosure, like reference numerals denote like features unless otherwise excepted.

Figure 2:
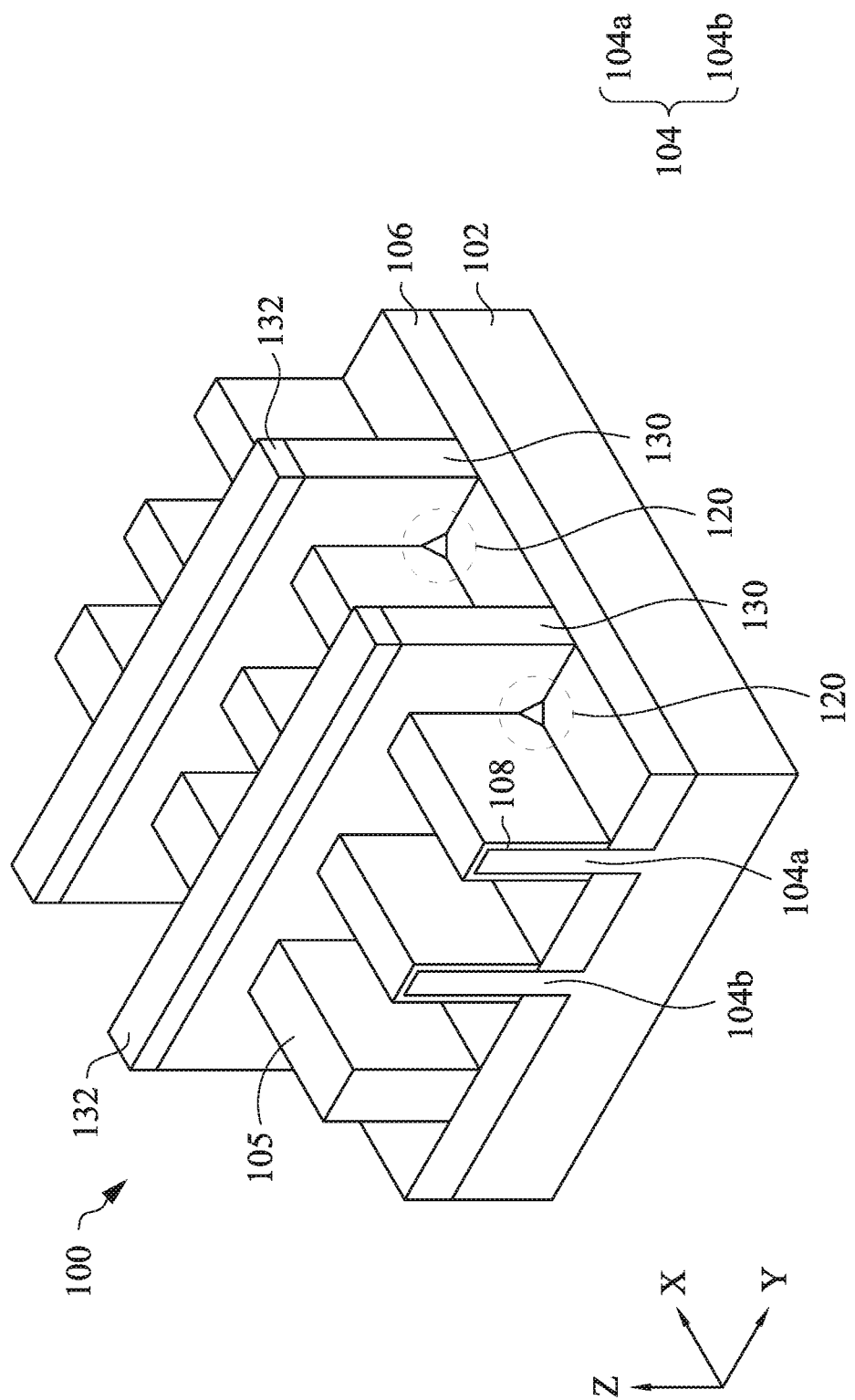
FIG. 2 illustrates a fragmentary perspective view of an exemplary workpiece, according to aspects of the present disclosure.
Figure 3A:
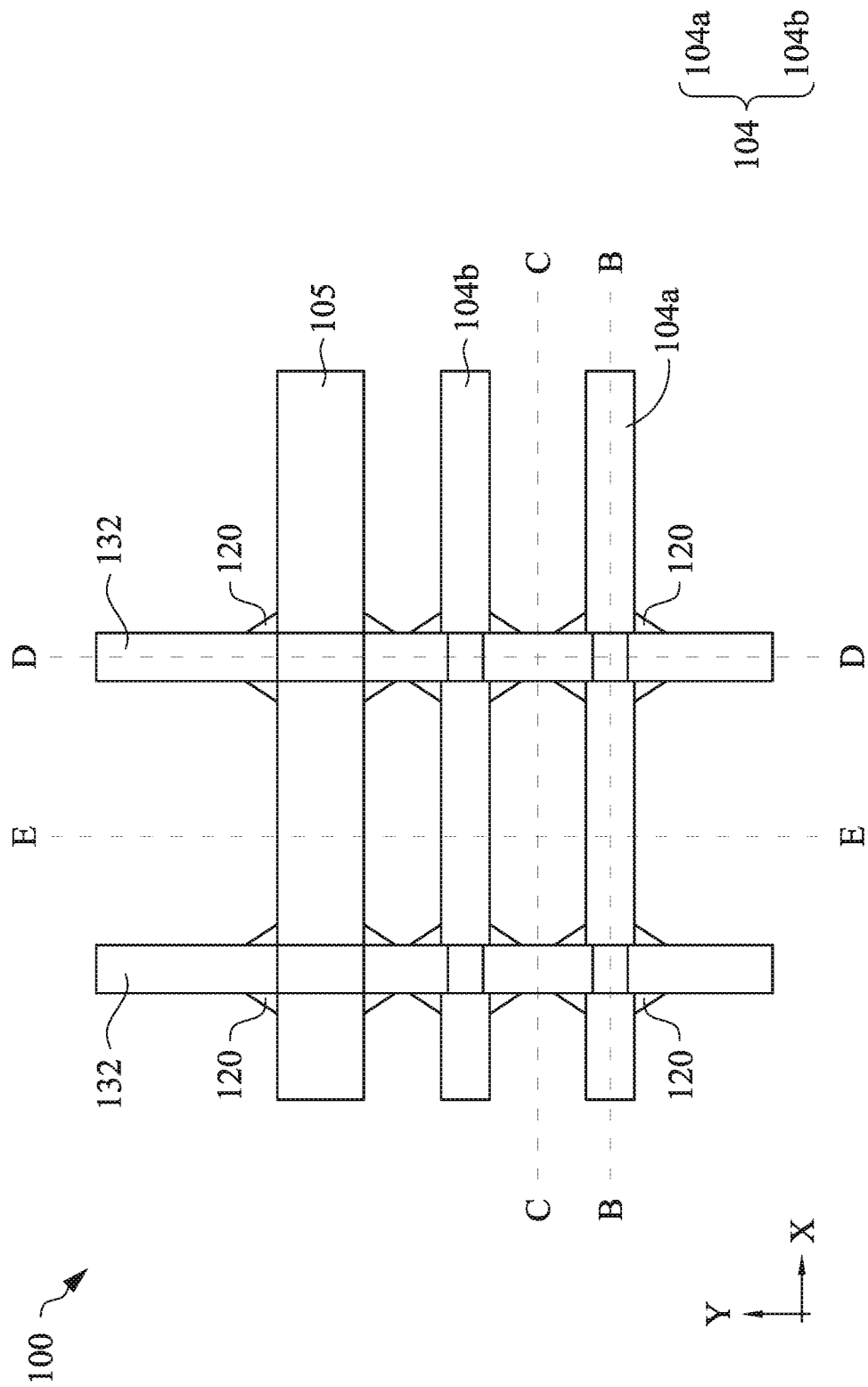
FIGS. 3A, 4A, 5A, 6A, 7A, 8A, 9A, and 10A illustrate fragmentary top views of an exemplary workpiece during various fabrication stages in the method of FIG. 1, according to various aspects of the present disclosure.

Referring to FIGS. 1, 2, and 3A-3E, method 10 includes a block 12 where the workpiece 100 is provided. FIGS. 2 and 3A depict a fragmentary perspective view and a fragmentary top view of the workpiece 100 to undergo various stages of operations in the method 10 of FIG. 1, respectively, according to various aspects of the present disclosure. FIGS. 3B-3E illustrate fragmentary cross-sectional views of the workpiece 100 taken along lines B-B, C-C, D-D, and E-E as shown in FIG. 3A, respectively.

The workpiece 100 may be an intermediate device fabricated during processing of an integrated circuit (IC) that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Figure 3E:
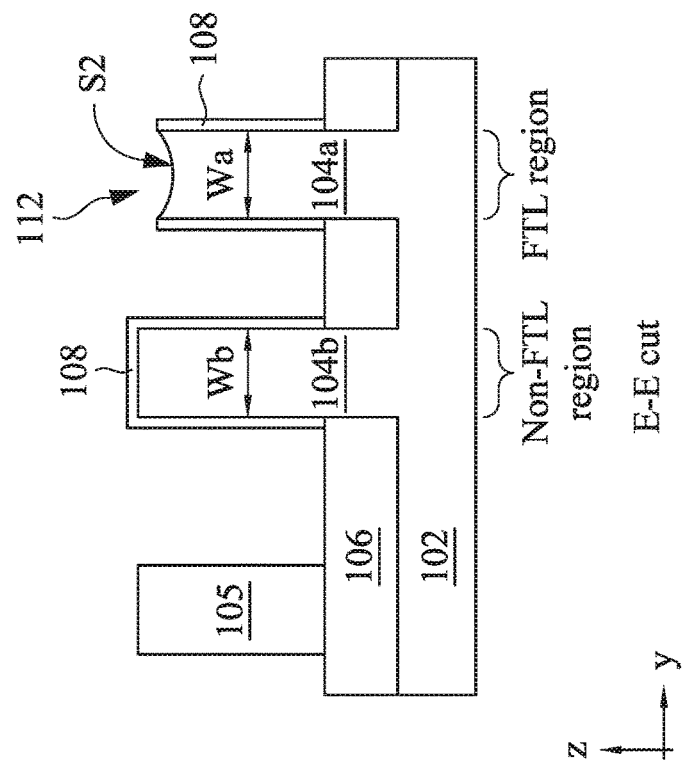

As illustrated in FIGS. 2-3E, the workpiece 100 includes a substrate 102. In the illustrated embodiment, the substrate 102 is a silicon substrate. Alternatively, the substrate 102 may include another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In another embodiment, the substrate 102 includes indium tin oxide (ITO) glass. In various embodiments, the substrate 102 is a wafer, such as a silicon wafer, and may include one or more epitaxially grown semiconductor layers in its upper portion.

In embodiments, the workpiece 100 includes a number of active regions 104 (e.g., fin-shaped active regions, also referred to as fins 104), such as fin 104a and fin 104b in FIGS. 2 and 3A, which may be separately or collectively referred to as fin(s) 104. As depicted in FIG. 2, each of the fins 104 extends lengthwise along the X direction. The fin 104a and fin 104b have a width Wa and a width Wb along the Y direction, respectively. The number of fins 104 and the number of dummy gate structures 130 shown in FIGS. 2 and 3A are for illustration purpose only and should not be construed as limiting the scope of the present disclosure. In the depicted embodiments, the fins 104 are disposed over the substrate 102. In embodiments where the workpiece 100 includes FinFETs, fins 104 may be formed of a single semiconductor element (e.g., Si). In embodiments where the workpiece 100 includes MBC transistors, the fins 104 include one or more nanostructures (e.g., a number of channel layers). Each of the nanostructures may be formed of silicon (Si).

In the present embodiments, the workpiece 100 also includes an isolation feature 106 formed around each fin 104 to isolate two adjacent fins 104. The isolation feature 106 may also be referred to as a shallow trench isolation (STI) feature and may include silicon oxide, silicon oxynitride, fluorine-doped silicate glass (FSG), a low-k dielectric, combinations thereof, and/or other suitable materials.

In embodiments, the workpiece 100 further includes a fin oxide layer 108 on surfaces of the fins 104, such as shown in FIG. 2. In the illustrated embodiment, the fin oxide layer 108 is formed as a blanket layer over top and sidewall surfaces of the fins 104 but not on the top surface of the isolation structure 106. In an alternative embodiment, the fin oxide layer 108 is formed on the top and sidewall surfaces of the fins 104 and over the top surface of the isolation structure 106. The fin oxide layer 108 may be formed before the dummy gate structures 130 and provide protection to the fins 104. The fin oxide layer 108 may be formed by various methods such as chemical oxidation of silicon, thermal oxidation of silicon, ozone oxidation of silicon, atomic layer deposition (ALD), chemical vapor deposition (CVD), physical vapor deposition (PVD), or other suitable methods. The fin oxide layer 108 may comprise silicon oxide or a high-k oxide (having a dielectric constant greater than that of silicon oxide) such as Hf oxide, Ta oxide, Ti oxide, Zr oxide, Al oxide or a combination thereof. The fin oxide layer 108 may be formed to have a thickness of a few angstroms to a few tens of angstroms. For the purpose of simplicity, in FIG. 3A, the fin oxide layer 108 is not explicitly depicted, however, its thickness along the Y direction is reflected in portions of the fins 104 not overlapped with gate hard mask layers 132 (i.e., not directly under the gate hard mask layers 132 (to be described below)). In other words, portions of the fins 104 not overlapped with gate hard mask layers 132 each reflects a width including a width of the fin 104 (e.g., Wa, Wb) and two times of the thickness of the fin oxide layer 108 along the Y direction; portions of the fins 104 overlapped with the gate hard mask layers 132 (i.e., directly under the gate hard mask layers 132) each reflects a width of the fin 104 (e.g., Wa, Wb) along the Y direction.

In some embodiments, the workpiece 100 further includes a dielectric fin 105 (also referred to as dummy fin 105) over the isolation structure 106. The dielectric fin 105 may be a portion of a hybrid fin. Forming of the dielectric fin 105 may include depositing a dielectric layer over the isolation structure 106, patterning the dielectric layer, and planarizing a top surface of the layer. The dielectric fin 105 may include any suitable dielectric material and may define the space in which source/drain epitaxial features are formed and therefore prevent undesirable merging of neighboring source/drain epitaxial features.

In embodiments, the workpiece 100 further includes the dummy gate structures 130 over the fins 104 and the fin oxide layer 108. The dummy gate structures 130 may be on top surfaces and sidewalls of the fin oxide layer 108. The dummy gate structures 130 may cross over one or a plurality of the fins 104, the isolation structure 106, and/or the dielectric fin 105. The dummy gate structures 130 also have lengthwise directions perpendicular to the lengthwise directions of the fins 104. In some examples, forming the dummy gate structures 130 includes depositing a dummy gate layer containing polysilicon or other suitable material and patterning the layer by a lithographic process and etching. The gate hard mask layer 132 may be formed on the dummy gate material layer and is used as an etch mask during the formation of the dummy gate structures 130. The gate hard mask layer 132 may include any suitable material, such as a silicon oxide, a silicon nitride, a silicon carbide, a silicon oxynitride, other suitable materials, and/or combinations thereof. In one embodiment, the gate hard mask layer 132 includes multiple films, such as silicon oxide and silicon nitride. In some embodiments, the patterning process to form the dummy gate structures 130 includes forming a patterned resist layer by lithography process; etching the hard mask layer using the patterned resist layer as an etch mask; and etching the dummy gate layer to form the dummy gate structures 130 using the patterned hard mask layer (i.e., the gate hard mask layer 132) as an etch mask.

Due to process reasons such as etching effects in the formation of the dummy gate structures 130, bottom portions of dummy gate structures 130 intersecting the fins 104 may be wider than other portions distant from the fins 104. The widening in the bottom portions of the dummy gate structures 130 intersecting the fins 104 is referred to as "footing effect", and the widening portions are referred to as footing regions (or portions) 120. In the Z direction, it is possible that the dummy gate structures 130 include an upper portion with straight and vertical sidewalls, and a lower portion with slanted sidewalls. The slanted sidewalls may also be straight, or may be substantially straight with a slight curve. The dummy gate structures 130 include exposed sidewalls S1.

Due to process reasons such as etching effects in the formation of the dummy gate structures 130, top portions of some regions of the fins 104 and the fin oxide layer 108 thereover may be removed. A region of the fins 104 having such fin top loss are also referred to as a fin top loss region (FTL region) and a region of the fins 104 not having fin top loss are also referred to as a non-FTL region. Such fin top loss may reduce effective channel regions and reduce current flow therein. In the depicted embodiment as in FIGS. 3B and 3E, the FTL region includes the portion of the fin 104a between two adjacent dummy gate structures 130, and the non-FTL region includes the fin 104b and the other portions of the fin 104a. A top portion of the FTL region and the fin oxide layer 108 thereover have been removed (e.g., during formation of the dummy gate structures 130), thereby forming an opening 112 (also referred to as a dent 112). Top portions of the non-FTL region remain protected by the fin oxide layer 108 and/or the dummy gate structures 130 thereover and top surfaces of the non-FTL region have similar heights. Thus, a top surface S2 of the fin 104a (e.g., the FTL region) is exposed to the opening 112 and is lower than a top surface of the non-FTL region.

In some embodiments, the dummy gate structures 130 include a void 131 adjacent to a sidewall of the dummy gate structures 130. The void 131 includes a surface S3 intersected with the sidewall S1. The surface S3 may include one or more surfaces having any shape, for example, the surface S3 may be a curved surface or includes multiple facets. In some embodiments, the void 131 is not through the dummy gate structures 130 as depicted in FIG. 3C. In some other embodiments, the void 131 spans horizontally through the dummy gate structures 130. In the cross-sectional view in FIG. 3D, the void 131 has a greatest width W along the Y direction. The void 131 may be disposed between the dielectric fin 105 and a fin 104. The void 131 may be formed during the formation of the dummy gate structures 130 (e.g., during the deposition of the dummy gate layer).

Figure 4A:
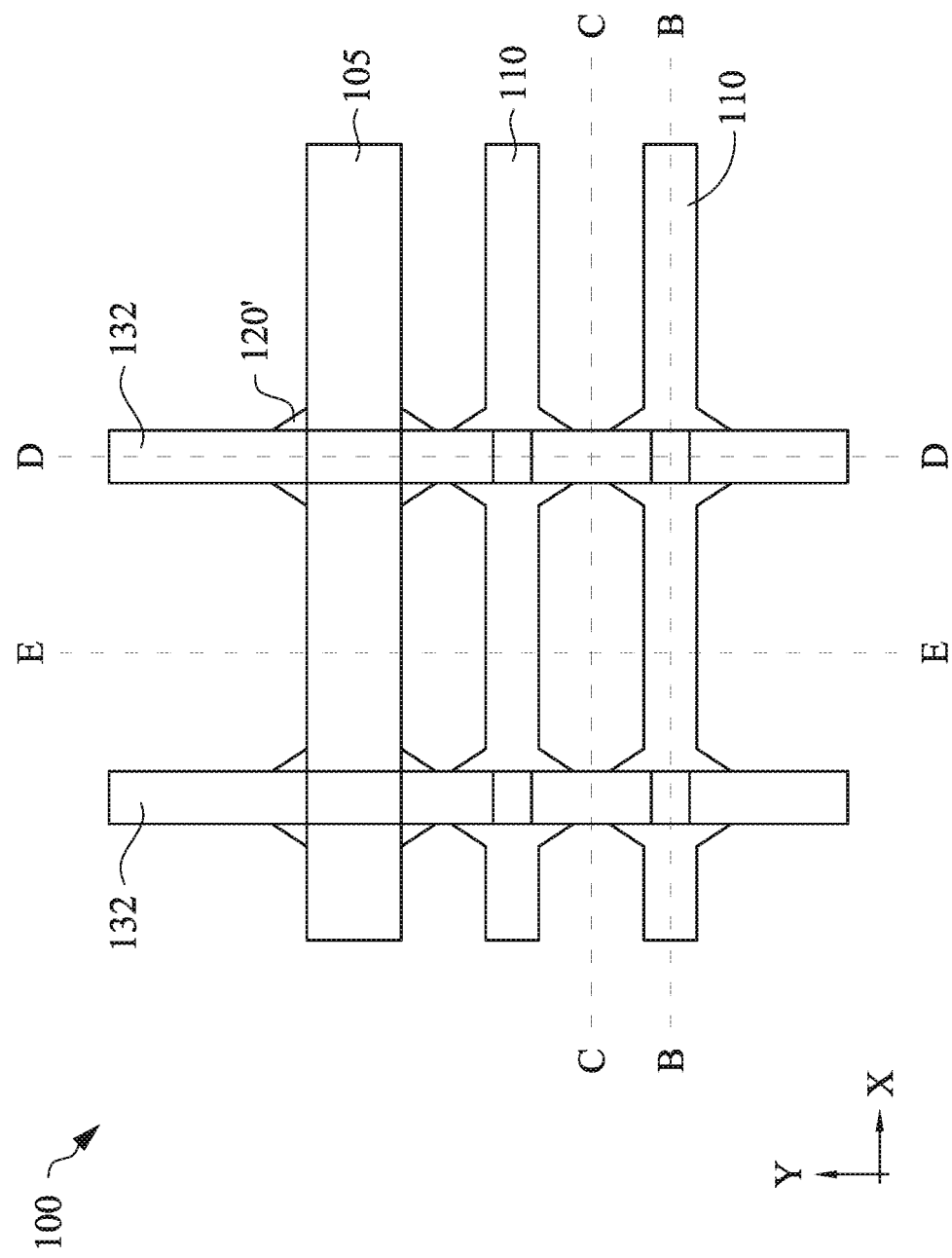
Figure 4E:
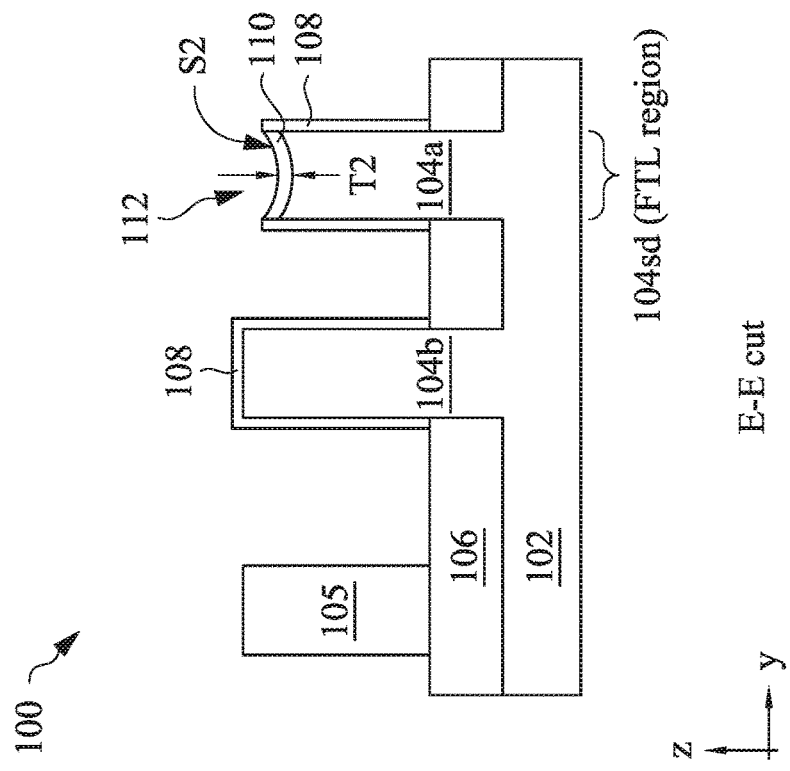
Figure 4D:
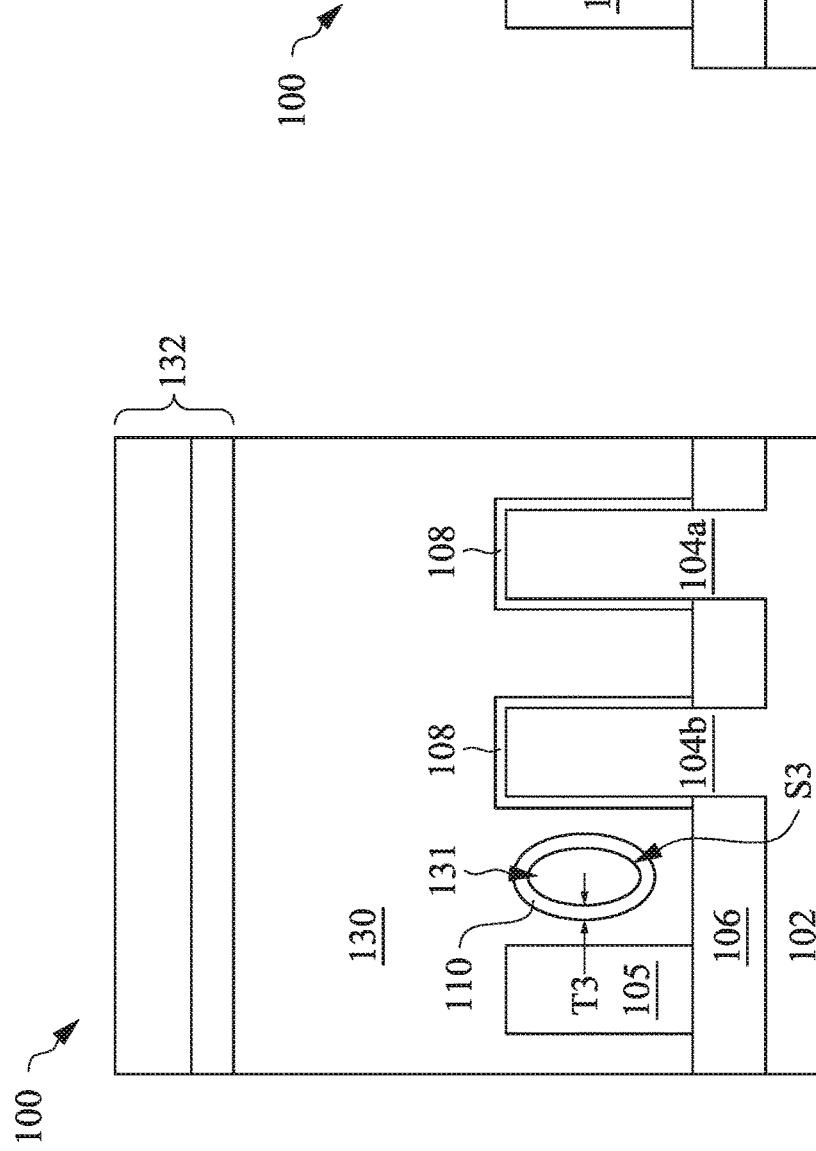

Referring to FIGS. 1 and 4A-4E, method 10 includes a block 14 where exposed surfaces of the fins 104 and the dummy gate structures 130 are oxidized to form an oxide layer 110. FIG. 4A depicts a fragmentary top view of the workpiece 100. FIGS. 4B-4E illustrate fragmentary cross-sectional views of the workpiece 100 taken along lines B-B, C-C, D-D, and E-E as shown in FIG. 4A, respectively.

In some embodiments, the oxide layer 110 is formed by performing an oxidizing process (also referred to as an oxidation process) to the workpiece 100. In embodiments, the exposed surfaces of the fins 104 and the dummy gate structures 130 include sidewalls S1 of the dummy gate structures 130, the top surface S2 of the fin 104a exposed to the opening 112, the surface S3 of the void 131, or any combination thereof. In some embodiments, the footing portions 120 are also oxidized to form a portion (also referred to as oxidized footing portions 120') of the oxide layer 110. Forming the oxide layer 110 may use any suitable method. In some embodiments, the oxidation process comprises a rapid thermal oxidation (RTO) process, high pressure oxidation (HPO), chemical oxidation process, in-situ stream generation (ISSG) process, or enhanced in-situ stream generation (EISSG) process. In some embodiments, the RTO process is performed at a temperature of about 400° C. to about 700° C., using oxygen ($O_2$) and ozone ($O_3$) as reaction gases, for about 1 second to about 30 seconds. In other embodiments, an HPO is performed using a process gas of $O_2$, $O_2$ and nitrogen ($N_2$), $N_2$, or the like, at a pressure from about 1 atm to about 25 atm and a temperature from about 300° C. to about 700° C., for about 1 minute to about 10 minutes. Examples of a chemical oxidation process include wet SPM (sulfuric acid ($H_2SO_4$) and/or hydrogen peroxide ($H_2O_2$)) clean, wet $O_3/H_2O$, or the like. In some embodiments, an ozonated deionized water ($DIO_3$) may be applied to the workpiece 100. The $DIO_3$ solution may have an ozone concentration of about 1 ppm to about 100 ppm, alternatively of about 30 ppm to about 50 ppm. Thereafter, an oxygen anneal (i.e., in a process chamber that includes an oxygen-containing gas) may be performed to the workpiece 100. The oxidation process results in the oxide layer 110 having determined thickness(s). The oxide layer 110 may have a thickness in a range of about 0.1 nm to about 5 nm, alternatively in a range of about 1 nm to about 3 nm. The oxide layer 110 formed to different exposed surfaces may have different thicknesses. In the depicted embodiment as in FIG. 4C, the void 131 may have a relatively small size and the oxide layer 110 formed to the surface S3 of the void 131 may have a thickness T3 along the Y direction less than a thickness T1 of the oxide layer 110 formed to the sidewalls S1 of the dummy gate structures 130 along the X direction. In some embodiments, the oxide layer 110 may not be formed on all of the exposed surfaces of the fins 104 and the dummy gate structures 130. For example, when a $DIO_3$ solution is applied, the $DIO_3$ may not contact all of the surface S3 of the void 131, thus only a portion or none of the surface S3 of the void 131 is oxidized. In some embodiments, the oxide layer 110 formed to the surface S2 of the fin 104a has a thickness T2 along the Z direction. T2 may be similar to T1. T2 and T1 may be in a range of about 0.3 nm to about 5 nm. If T1 and T2 are too small, the footing portions 120 may not be completely oxidized. If T1 and T2 are too large, too much of the dummy gate structures 130 and/or the top portion of the fin 104a exposed to the opening 112 may be oxidized, which may increase difficulty in the following steps of removing the oxide layer 110 (to be described below) and may cause defects in the dummy gate structures 130 and/or the fin 104a; in addition, too much epitaxial layer will have to be grown in the following steps (to be described below), resulting in unnecessary cost of material and time.

Figure 5A:
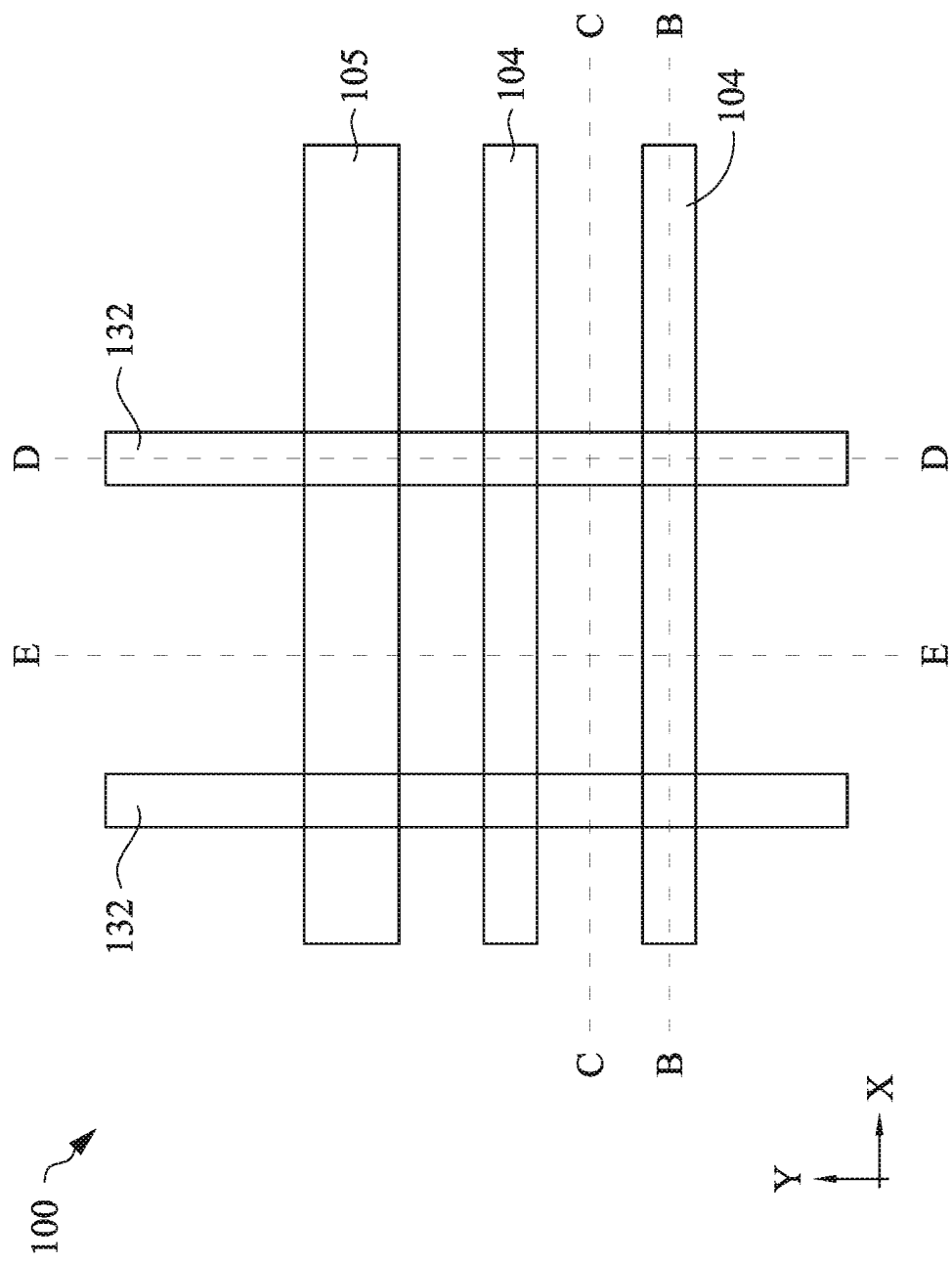

Referring to FIGS. 1 and 5A-5E, method 10 includes a block 16 where the oxide layer 110 is removed. FIG. 5A depicts a fragmentary top view of the workpiece 100, FIGS. 5B-5E illustrate fragmentary cross-sectional views of the workpiece 100 taken along lines B-B, C-C, D-D, and E-E as shown in FIG. 5A, respectively.

In some embodiments, an exposed portion of the fin oxide layer 108 uncovered by (i.e., not directly under) the dummy gate structures 130 is also removed in this step. After removing the oxide layer 110 and the exposed portion of the fin oxide layer 108, unoxidized surfaces of the fins 104 and the dummy gate structures 130 are exposed. Such unoxidized surfaces may include unoxidized sidewalls S1' of the dummy gate structures 130, unoxidized sidewalls S4' of the fins 104, unoxidized top surface S2' of the FTL region of the fin 104a, unoxidized top surface S5' of the non-FTL region of the fin 104a and 104b, unoxidized surface S3' of the void 131, or any combination thereof. In some embodiments, the oxidized footing portions 120' are removed in this step. S5' may be higher than S2'.

Removing the oxide layer 110 and the exposed portion of the fin oxide layer 108 may use any suitable method. In an example, the removing process (block 16) may be performed using a wet etch process. In some embodiments, cycles of a high temperature sulfuric peroxide mixture (HTSPM) and dilute hydrofluoric acid (dHF), ozone ($O_3$) and dHF, or a combination thereof, may be used to perform the removing process.

Figure 6A:
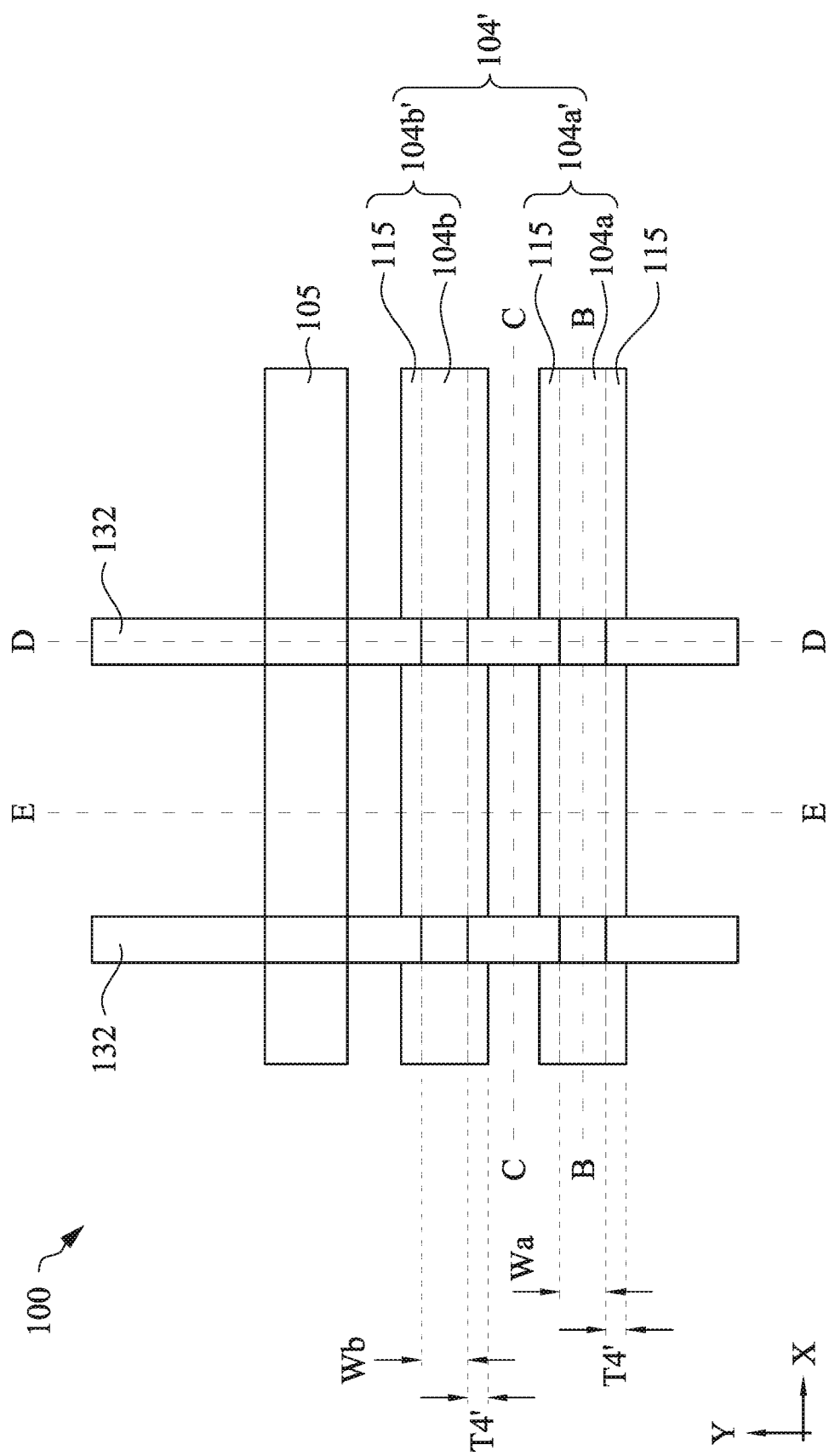

Referring to FIGS. 1 and 6A-6E, method 10 includes a block 18 where an epitaxial layer 115 (also referred to as a cap layer 115) is grown on the unoxidized surfaces of the fins 104 and the dummy gate structures 130. FIG. 6A depicts a fragmentary top view of the workpiece 100, FIGS. 6B-6E illustrate fragmentary cross-sectional views of the workpiece 100 taken along lines B-B, C-C, D-D, and E-E as shown in FIG. 6A, respectively.

In some implementations, the epitaxial layer 115 is directly grown from the unoxidized surfaces of the fins 104 and the dummy gate structures 130. In some other implementations, the epitaxial layer 115 is not directly grown from the unoxidized surfaces of the fins 104 and the dummy gate structures 130. In those implementations, a seed layer (not shown) may be formed on the unoxidized surfaces of the fins 104 and the dummy gate structures 130 and the epitaxial layer 115 is then formed on the seed layer. In some embodiments, the epitaxial layer 115 includes silicon, carbon, germanium, or a combination thereof. In some embodiments, the epitaxial layer 115 includes silicon. In some embodiments, the epitaxial layer 115 includes a composition different from the fins 104. In the depicted embodiment, the epitaxial layer 115 includes a same composition as the fins 104 and is divided from the fins 104 by dashed lines. An example where the epitaxial layer 115 is formed of silicon is described below for illustration purposes. The epitaxial layer 115 is epitaxially grown using source gases such as silane ($SiH_4$), silicon tetrachloride ($SiCl_4$), trichlorosilane (TCS), or dichlorosilane ($SiH_2Cl_2$ or DSC). Hydrogen ($H_2$) can be used as a reactant gas that reduces the aforementioned source gases. The deposition temperature during formation of the epitaxial layer 115 can range from about 700° C. to about 1250° C. depending on the gases used. For example, source gases with fewer chlorine atoms (e.g., DSC) may be used at lower formation temperatures compared to source gases with more chlorine atoms, such as $SiCl_4$ or TCS. The aforementioned ranges and type of gases are provided as examples and are not limiting. In embodiments, growth rates of the epitaxial layer 115 on the unoxidized surfaces of the fins 104 and the dummy gate structures 130 may be different, which may result in different thicknesses of the epitaxial layer 115 on the unoxidized surfaces of the fins 104 and the dummy gate structures 130. Forming the epitaxial layer 115 may be a time-controlled process, such that final thicknesses of the epitaxial layer 115 are achieved at the end of the process.

The fins 104 and the epitaxial layer 115 over the fins 104 collectively form new fins including fins 104a' and 104b', which may be separately or collectively referred to as fin(s) 104'. Therefore, a top portion of the fin 104' above a top surface of the isolation feature 106 is wider than a bottom portion of the fin 104' below the top surface of the isolation feature 106 along the Y direction. In some embodiments, the epitaxial layer 115 has a thickness in a range of about 0.1 nm to about 5 nm. If the thickness is too small, fin top loss may not be recovered, the void may be too large and impact the overall performance of the semiconductor structure, and/or the dummy gate structure 130 may be too narrow along the X direction and thus be more likely to collapse in the following steps. If the thickness is too large, adjacent fins 104' may be too close to each other, and/or adjacent dummy gate structures 130 may be too close to each other. In embodiments, the epitaxial layer 115 on different unoxidized surfaces are different. This may result from various shapes, materials, and directions of the different unoxidized surfaces, as well as operating conditions of the epitaxial growing process such as seed materials, etc. In some embodiments, the epitaxial layer 115 has a thickness T1' on the unoxidized sidewalls S1' of the dummy gate structures 130, a thickness T2' on the unoxidized top surface S2' of the FTL region, a thickness T5' on the unoxidized top surface S5' of the non-FTL region, a thickness T3' on the unoxidized surface S3' of the void 131, and a thickness T4' on the unoxidized sidewalls S4' of the fins 104. In some embodiments, T2' is equal to or greater than T5'. In embodiments, T2' and T5' are each equal to or greater than T1', T2' and T5' are each equal to or greater than T4'. In some embodiments. T3' is equal to or greater than T1' and/or T4'.

Figure 3D:
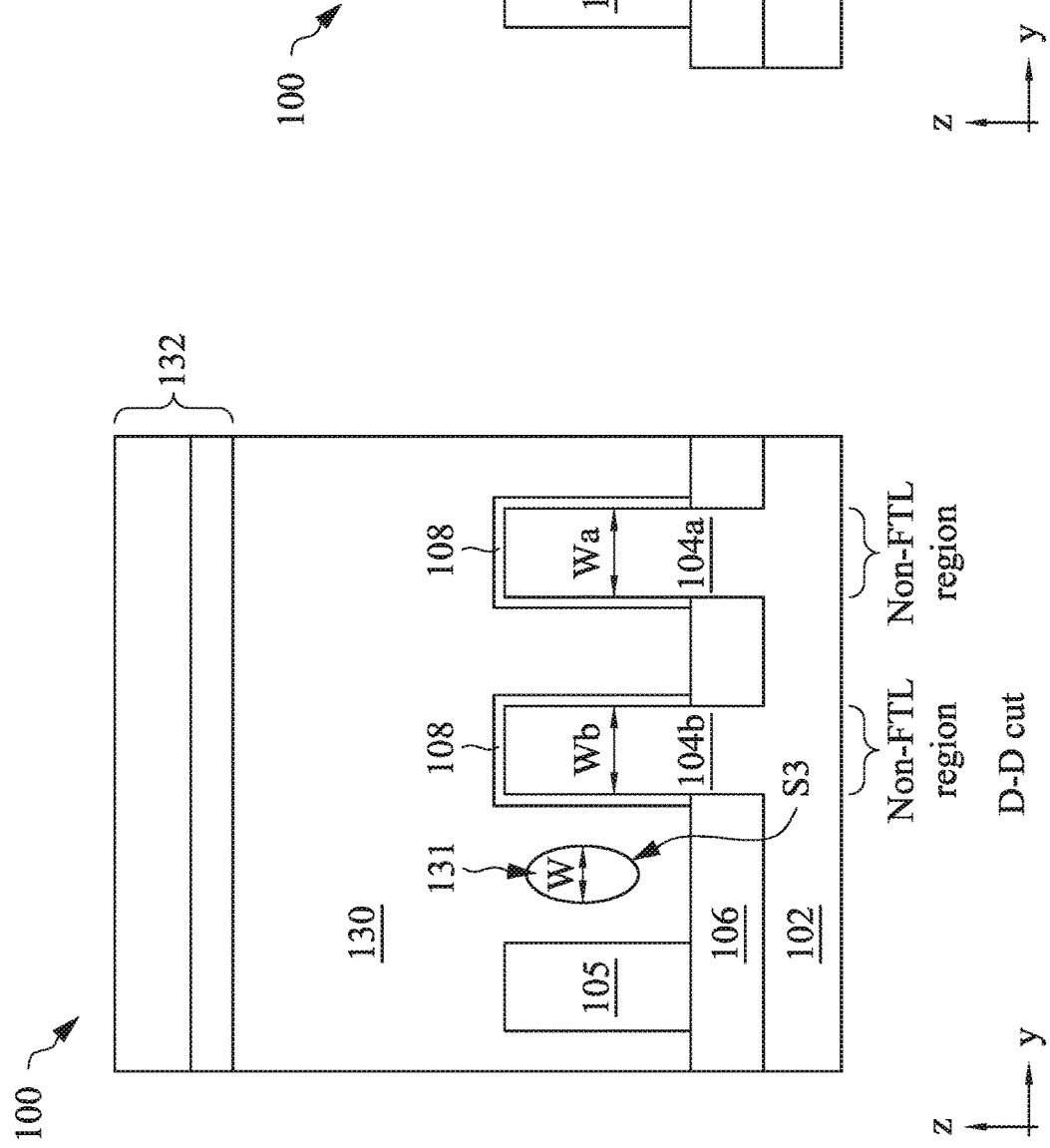

In some embodiments, T1' is about the same as the thickness T1 of the oxide layer 110 formed to the sidewalls S1 of the dummy gate structures 130. In some embodiments, T2' is greater than the thickness T2 of the oxide layer 110 formed to the top surface S2 of the fin 104a. Thus, in the cross-sectional view in FIG. 6E, a lowest top surface of the fin 104a' exposed to the opening 112 is higher than a lowest top surface of the fin 104a exposed to the opening 112. In other words, the fin top loss of the FTL region of the fin 104a is recovered and the top surface of the FTL region is elevated by about (T2'-T2) along Z direction. A portion of a top surface S2" of the epitaxial layer 115 in the FTL region may be lower than a top surface S5" of the epitaxial layer 115 in the non-FTL region and higher than the unoxidized top surface S5' of the non-FTL region of the fins 104 before forming the epitaxial layer 115. In some embodiments, T3' is greater than the thickness T3 of the oxide layer 110 formed to the surface S3 of the void 131. Therefore, in the cross-sectional view in FIG. 6D, the void 131 has a greatest width W' along the Y direction, which is less than the greatest width W before the oxidation process as shown in FIG. 3D. In other words, the dimension of the void 131 is reduced by about (W-W'). In the embodiments where the epitaxial layer 115 completely fills the void 131. W' is equal to zero. In the FTL regions and between two adjacent epitaxial layers 115 on two opposing unoxidized sidewalls S1' of the dummy gate structures 130, the fins 104a' and 104b' have a width of (Wa+2*T4') and a width of (Wb+2*T4') along the Y direction, respectively. It is noted that portions of the fins 104 directly below the dummy gate structures 130 may keep the widths Wa and Wb along the Y direction along the processes. Referring to FIG. 6A, from a top view, the fins 104' each does not have a constant width, but junctions where the width changes, which is referred to as a fin jog structure. The fin jog structure includes two wider portions and a narrower portion extending between the two wider portions. The two wider portions each have the width of (Wa+2*T4') or the width of (Wb+2*T4') along the Y direction. The two wider portions are not directly under the gate hard mask layer 132. In some embodiments, the narrower portion is under the gate hard mask layer 132 and has a width of Wa or Wb along the Y direction. In the following processes, after gate replacement (e.g., block 26), the narrower portion will be directly under a metal gate structure (to be described later).

After the step of block 18, top portions of the fins 104' above the top surface of the isolation feature 106 and not directly under the dummy gate structures 130 are enlarged along the Z direction and the Y direction. Bottom portions of the fins 104' below the top surface of the isolation feature 106 remain the dimensions of the fins 104. Such enlargement may increase current driving capability in those portions of the fins 104' during operation of the semiconductor structure 100.

Referring to FIG. 1, method 10 further includes a block 20 where an annealing process is performed to the workpiece 100. The annealing process may include a rapid thermal annealing (RTA), a millisecond annealing (MSA), a microsecond annealing (USA), a microwave annealing, a laser annealing, a spike annealing, a soak annealing, a furnace annealing, other suitable annealing process, or a combination thereof.

Figure 7A:
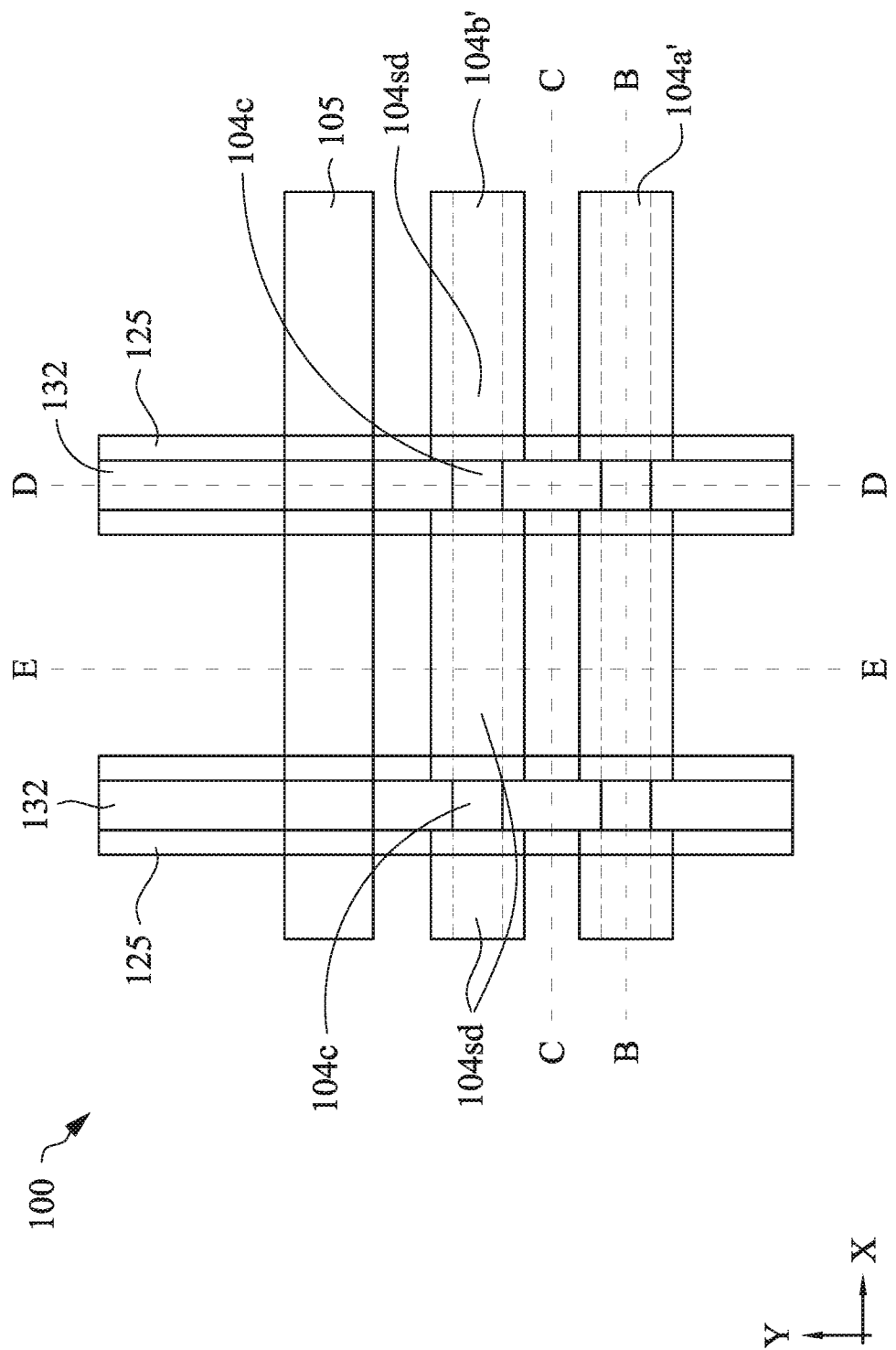
Figure 7E:
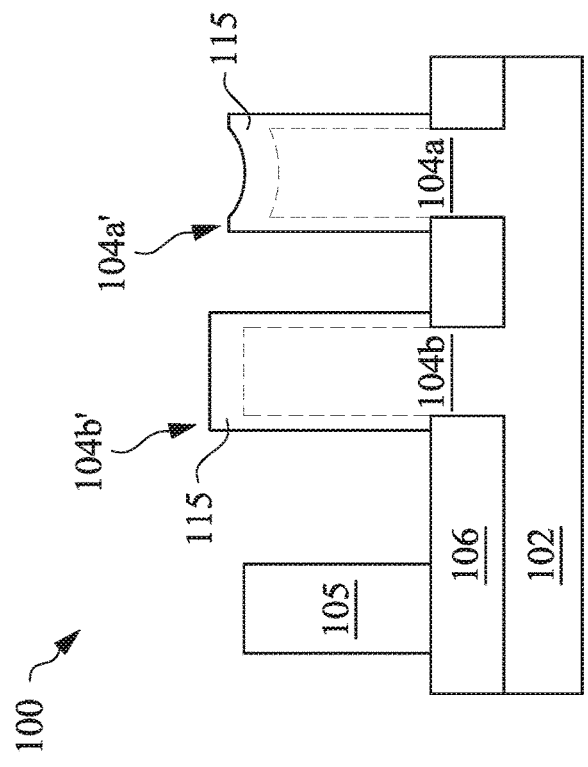
Figure 7E:

Referring to FIGS. 1 and 7A-7E, method 10 includes a block 22 where gate spacers 125 are formed on the epitaxial layer 115 that is on the unoxidized sidewalls S1' of the dummy gate structures 130. FIG. 7A depicts a fragmentary top view of the workpiece 100, FIGS. 7B-7E illustrate fragmentary cross-sectional views of the workpiece 100 taken along lines B-B, C-C, D-D, and E-E as shown in FIG. 7A, respectively.

Figure 7D:
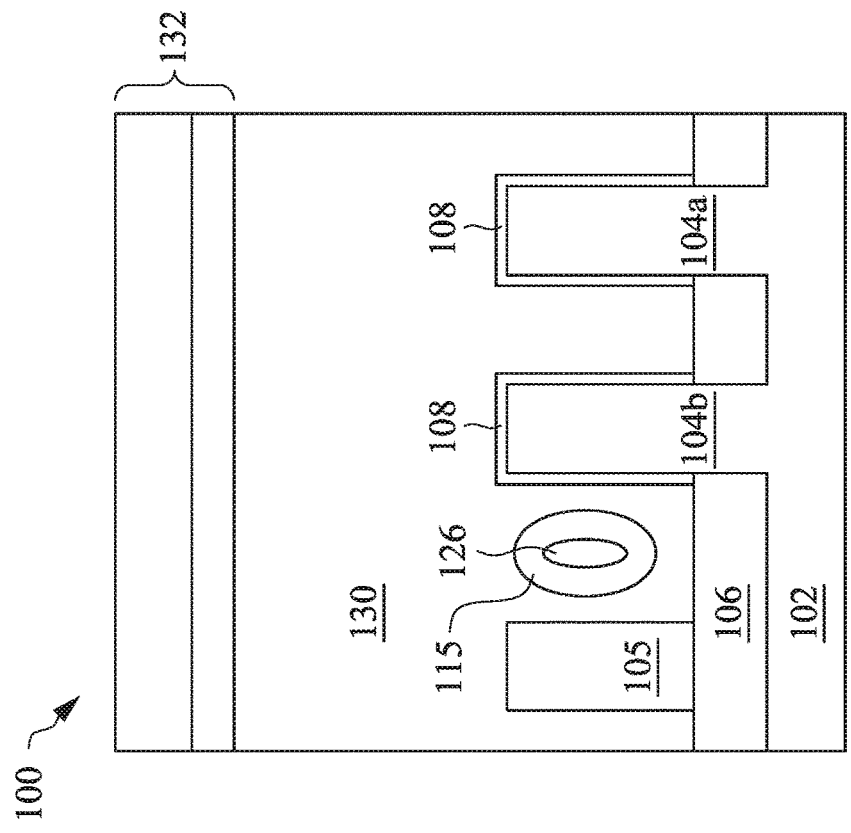
Figure 7D:

The gate spacers 125 may have a thickness from about 2 nm to about 10 nm. In some embodiments where the epitaxial layer 115 does not completely fill the void 131, the gate spacers 125 fill the remaining void 131 as shown in FIGS. 7C and 7D, thereby forming a bump 126 of the gate spacers 125. In some examples, the gate spacers 125 may include a dielectric material such as silicon oxide, silicon nitride, silicon carbide, silicon oxynitride, SiCN, silicon oxycarbide, SiOCN, a low-k material, and/or combinations thereof. In some embodiments, the gate spacers 125 include multiple layers, such as a liner spacer layer and a main spacer layer, and the like. By way of example, the gate spacers 125 may be formed by conformally depositing a dielectric material over the workpiece 100 using processes such as a CVD process, a subatmospheric CVD (SACVD) process, a flowable CVD process, an ALD process, a PVD process, or other suitable process. Following the conformal deposition of the dielectric material, portions of the dielectric material used to form the gate spacers 125 may be etched-back to expose portions of the fins 104' (e.g., in source/drain regions 104sd, to be described below). In some cases, the etch-back process removes portions of dielectric material used to form the gate spacers 125 along a top surface of the dummy gate structure 130, thereby exposing the gate hard mask layer 132. In some embodiments, the etch-back process may include a wet etch process, a dry etch process, a multiple-step etch process, and/or a combination thereof. It is noted that after the etch-back process, the gate spacers 125 remain disposed on the epitaxial layer 115 that is on the unoxidized sidewalls S1' of the dummy gate structures 130. Widths and heights of the fins 104' directly under the gate spacers 125 may be greater than widths and heights of the fins 104' directly under the dummy gate structures 130, respectively. In some embodiments, on two sides of a dummy gate structure 130, the top surface S5" of the epitaxial layer 115 is higher than the portion of the top surface S2" of the epitaxial layer 115, thus the gate spacers 125 on the two sides of the dummy gate structure 130 and interfacing the top surface S5" and the portion of the top surface S2" have different heights. The regions of the fins 104' directly under the gate hard mask layer 132 and the gate spacers 125 may be referred to as channel regions 104c. The regions of the fins 104' not directly under the gate hard mask layer 132 or the gate spacers 125 may be referred to as source/drain regions 104sd. The source/drain region(s) 104sd may refer to a source region or a drain region, individually or collectively dependent upon the context. The FTL region may be wider than the source/drain region 104sd along the X direction as shown in FIG. 7B.

Figure 8A:
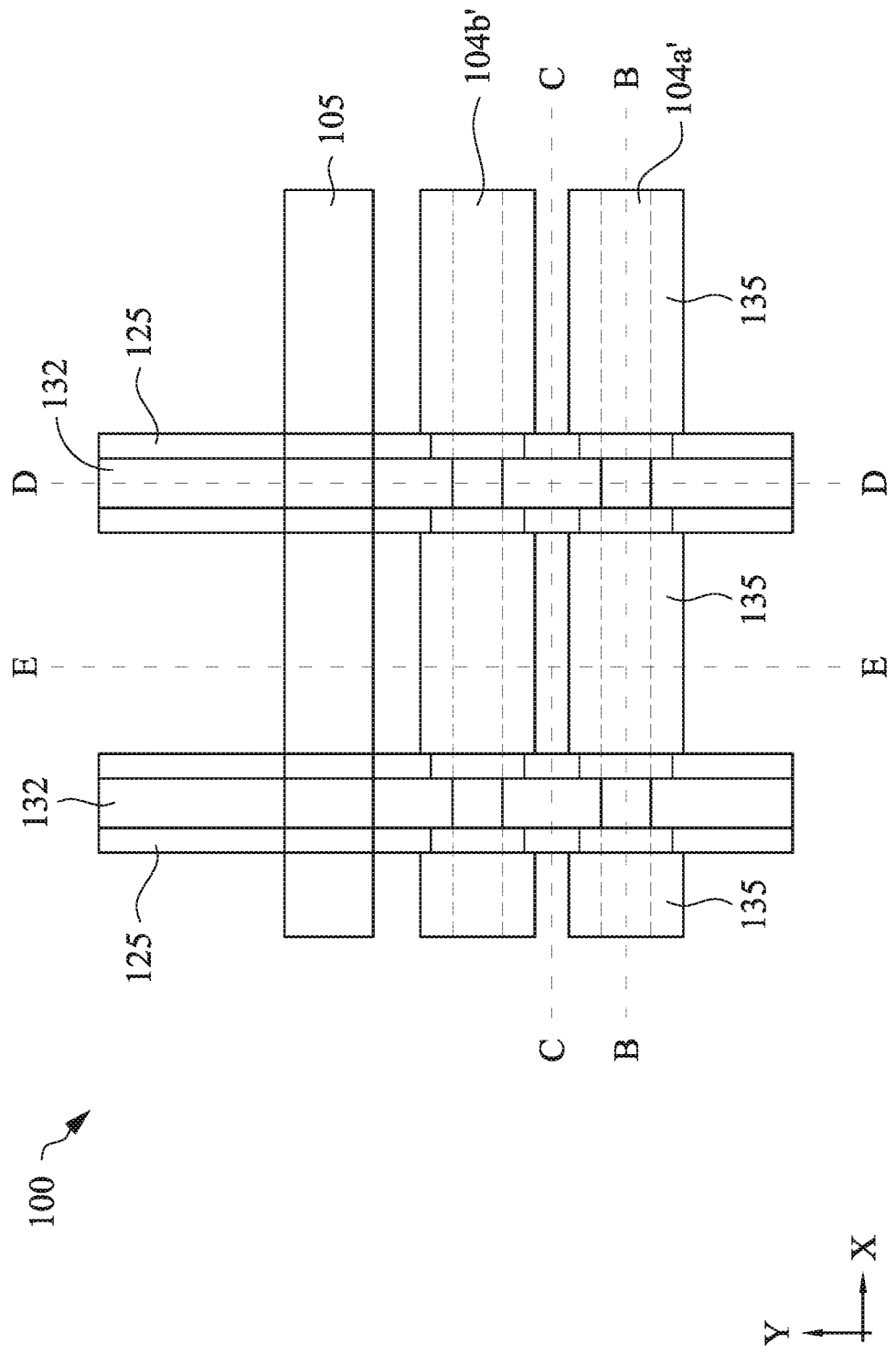

Referring to FIGS. 1 and 8A-8E, method 10 includes a block 24 where source/drain features 135 are formed on the source/drain regions 104sd of the fins 104'. FIG. 8A depicts a fragmentary top view of the workpiece 100, FIGS. 8B-8E illustrate fragmentary cross-sectional views of the workpiece 100 taken along lines B-B, C-C, D-D, and E-E as shown in FIG. 8A, respectively.

The source/drain features 135 may be formed by any suitable techniques, such as etching processes followed by one or more epitaxial growth processes. In one example, one or more etching processes are performed to remove portions of the fins 104' to form recesses in the source/drain regions 104sd. A cleaning process may be performed to clean the recesses with a hydrofluoric acid (HF) solution or other suitable solution. Subsequently, one or more epitaxial growth processes are performed to grow epitaxial source/drain features in the recesses. A top surface of the source/drain features 135 may be higher than a top surface of the fins 104'. The source/drain features 135 may be grown from top surfaces and sidewalls of the fins 104' exposed to the recesses. Because widths and heights of the fins 104' directly under the gate spacers (i.e., the portion of the fins 104' laterally exposed to the recesses) are increased from the fins 104 in steps of block 18, the area of exposed surfaces of the fins 104' where the source/drain features 135 are grown from (also referred to as exposed fin area) is increased. In the depicted embodiments, the recesses extend into the bottom portions of the fins 104' below the top surface of the isolation features 106. In some other embodiments, bottom surfaces of the recesses are above the top surface of the isolation features 106. Because the top portions of the fins 104' are wider than the bottom portions of the fins 104' along the Y direction, the recesses may have a larger surface area. Each of the source/drain features 135 may be suitable for forming a p-type FinFET device or alternatively, an n-type FinFET device. The p-type source/drain features may include one or more epitaxial layers of silicon germanium (epi SiGe) doped with a p-type dopant such as boron, germanium, indium, and/or other p-type dopants. The n-type source/drain features may include one or more epitaxial layers of silicon (epi Si) or silicon carbon (epi SiC) doped with an n-type dopant such as arsenic, phosphorus, and/or other n-type dopant.

Figure 8C:
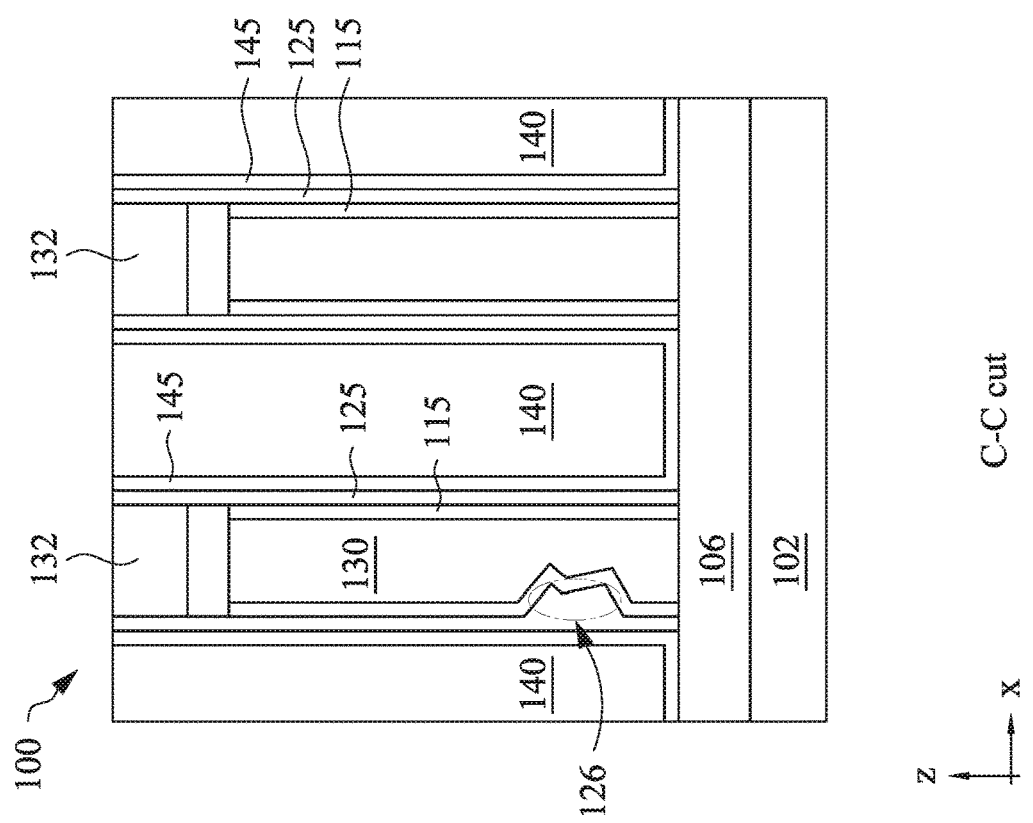
Figure 8B:
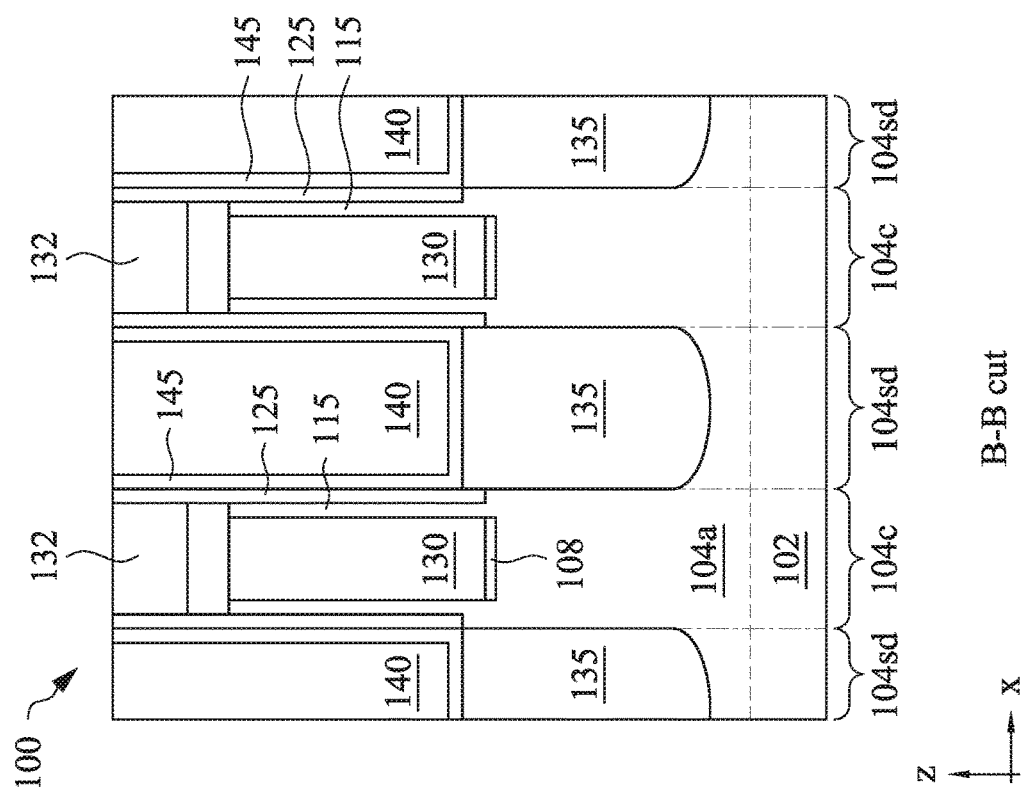

In some embodiments, a contact etch stop layer (CESL) 145 and an interlayer dielectric (ILD) layer 140 are formed over the workpiece 100 as shown in FIGS. 8B, 8C, and 8E. The CESL 145 may be formed of silicon nitride, silicon carbo-nitride, or the like. The CESL 145 may be formed using a conformal deposition method such as ALD or CVD, for example. The ILD layer 140 may include a dielectric material formed using, for example, FCVD, spin-on coating, CVD, or another deposition method. The ILD layer 140 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding is performed to level the top surfaces of the CESL 145, the ILD layer 140, dummy gate structures 130, and gate spacers 125 with each other. The planarization step may remove the gate hard mask layer 132 in some embodiments.

Referring to FIGS. 1 and 9A-10F, method 10 includes a block 26 where the dummy gate structures 130, the epitaxial layer 115 on unoxidized sidewalls S1' of the dummy gate structures 130, and the fin oxide layer 108 are replaced by metal gate structures 155.

Figure 9A:
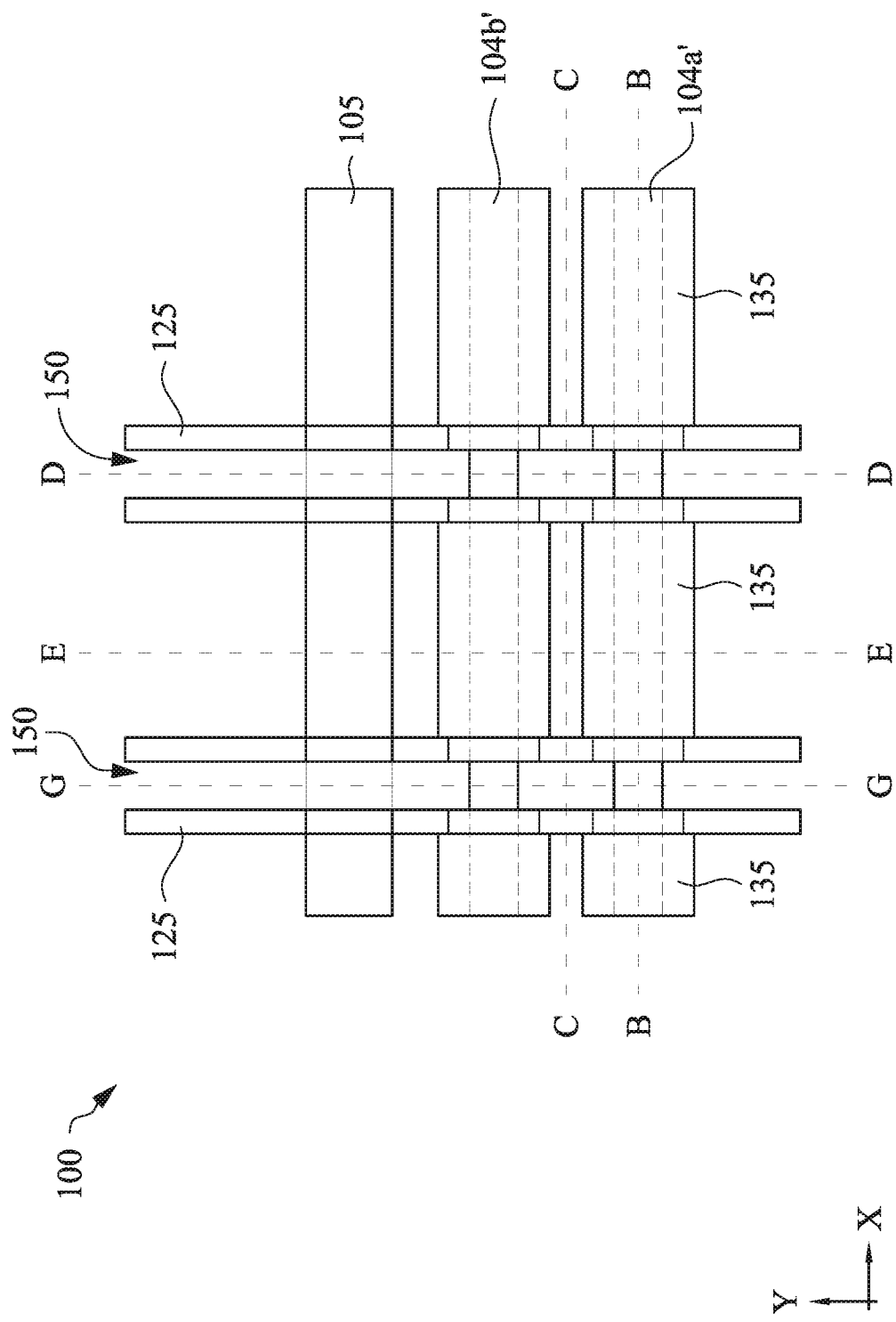
Figure 9C:
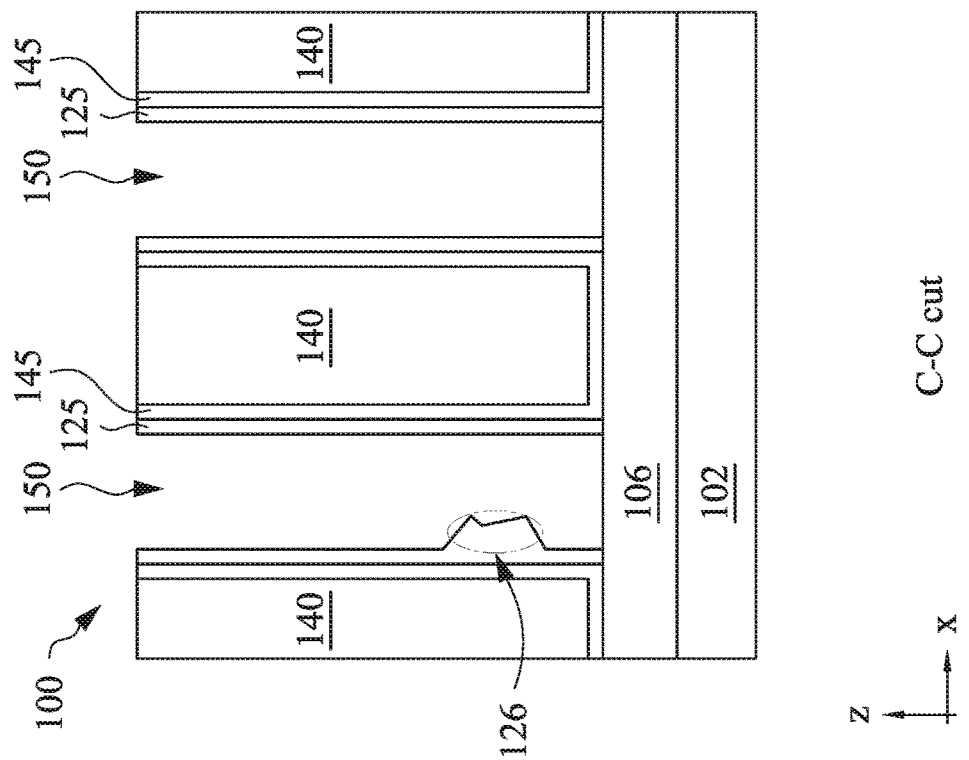
Figure 9B:
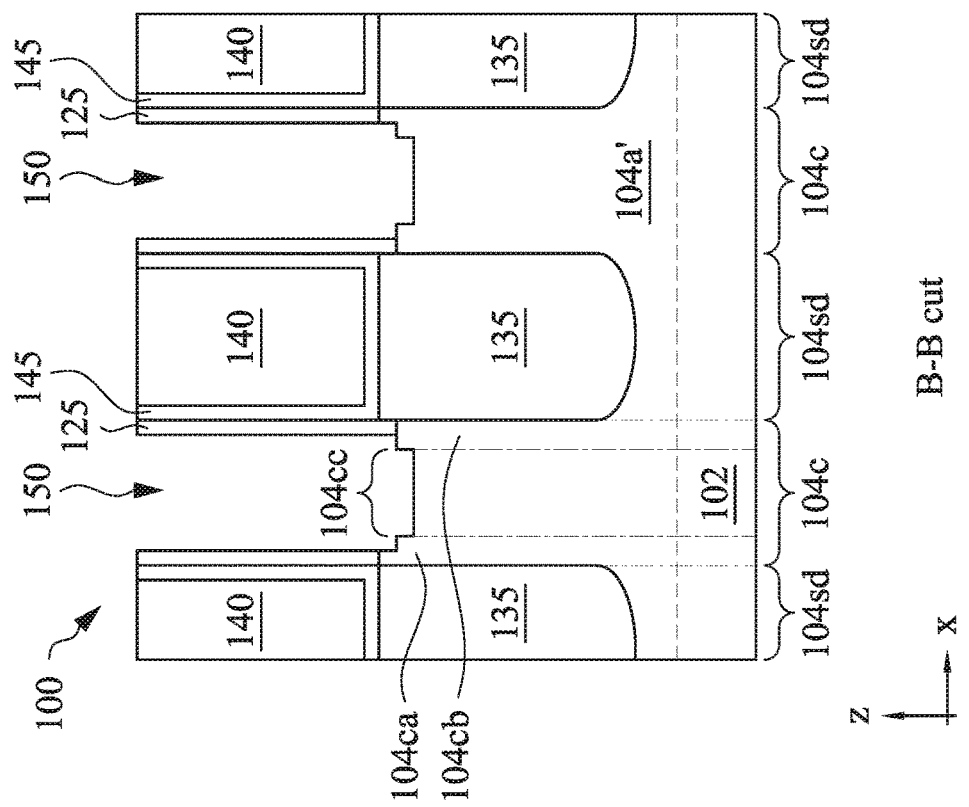
Figure 9E:
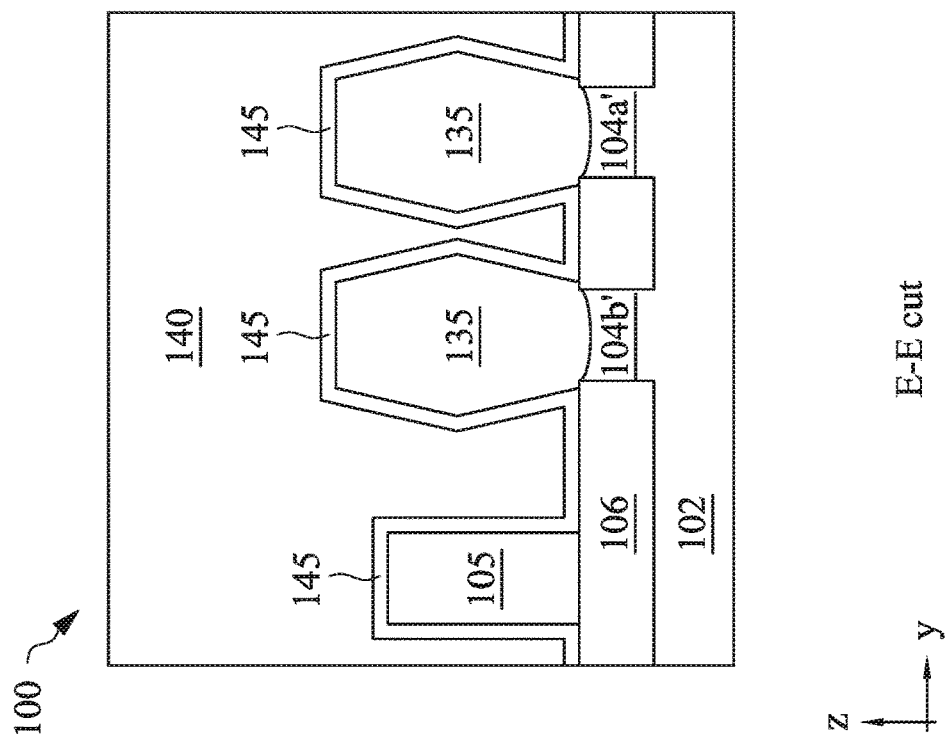
Figure 9D:
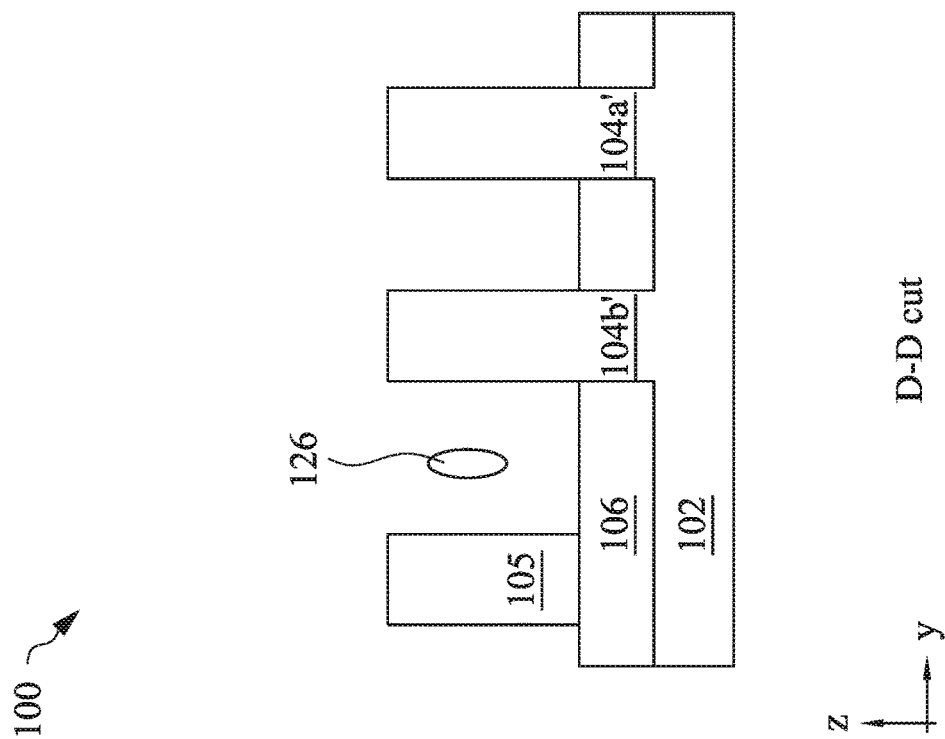

With reference to FIGS. 9A-9E, the dummy gate structures 130, the epitaxial layer 115 on unoxidized sidewalls S1' of the dummy gate structures 130, and the fin oxide layer 108 are removed to form gate trenches 150, and the resultant structure is shown in FIGS. 9A-9E. FIG. 9A depicts a fragmentary top view of the workpiece 100, FIGS. 9B-9E illustrate fragmentary cross-sectional views of the workpiece 100 taken along lines B-B, C-C, D-D, and E-E as shown in FIG. 9A, respectively.

In some embodiments, top surfaces and sidewalls of the fins 104' in the channel regions 104c, top surfaces and sidewalls of the dielectric fin 105, and sidewalls of the gate spacers 125 including the bump 126 are exposed in the gate trenches 150. In the depicted embodiment, the dummy gate structures 130 and the epitaxial layer 115 on unoxidized sidewalls S1' of the dummy gate structures 130 are completely removed. In some other embodiments, a portion of the dummy gate structures 130 and/or the epitaxial layer 115 on unoxidized sidewalls S1' of the dummy gate structures 130 directly under the bump 126 remain. However, because the dimensions of the void 131 have been reduced in the present method, such remaining portion may be negligible. The fin oxide layer 108 may also be removed. In some embodiments, a top surface of the fins 104' have stepped profile in the channel regions 104c. In some embodiment, a top surface of a central portion 104cc of the fins 104' along a central line along the Y direction (e.g., line G-G) is lower than top surfaces of side portions 104ca and 104cb of the fins 104'. The side portion 104ca may have stepped top surfaces, a lower surface of which is at the same level as a top surface of the side portion 104cb. This step may include one or more etching processes that are selective to the material in the dummy gate structures 130 and the fin oxide layer 108, respectively. For example, recessing the dummy gate structures 130 and the epitaxial layer 115 on unoxidized sidewalls S1' of the dummy gate structures 130 may be performed using a selective etch process such as a selective wet etch, a selective dry etch, or a combination thereof. In an embodiment, recessing the fin oxide layer 108 is performed using a solution having a fluoride compound as an etchant to remove the fin oxide layer 108. The fluoride compound is effective at removing a silicon oxide material.

Figure 10A:
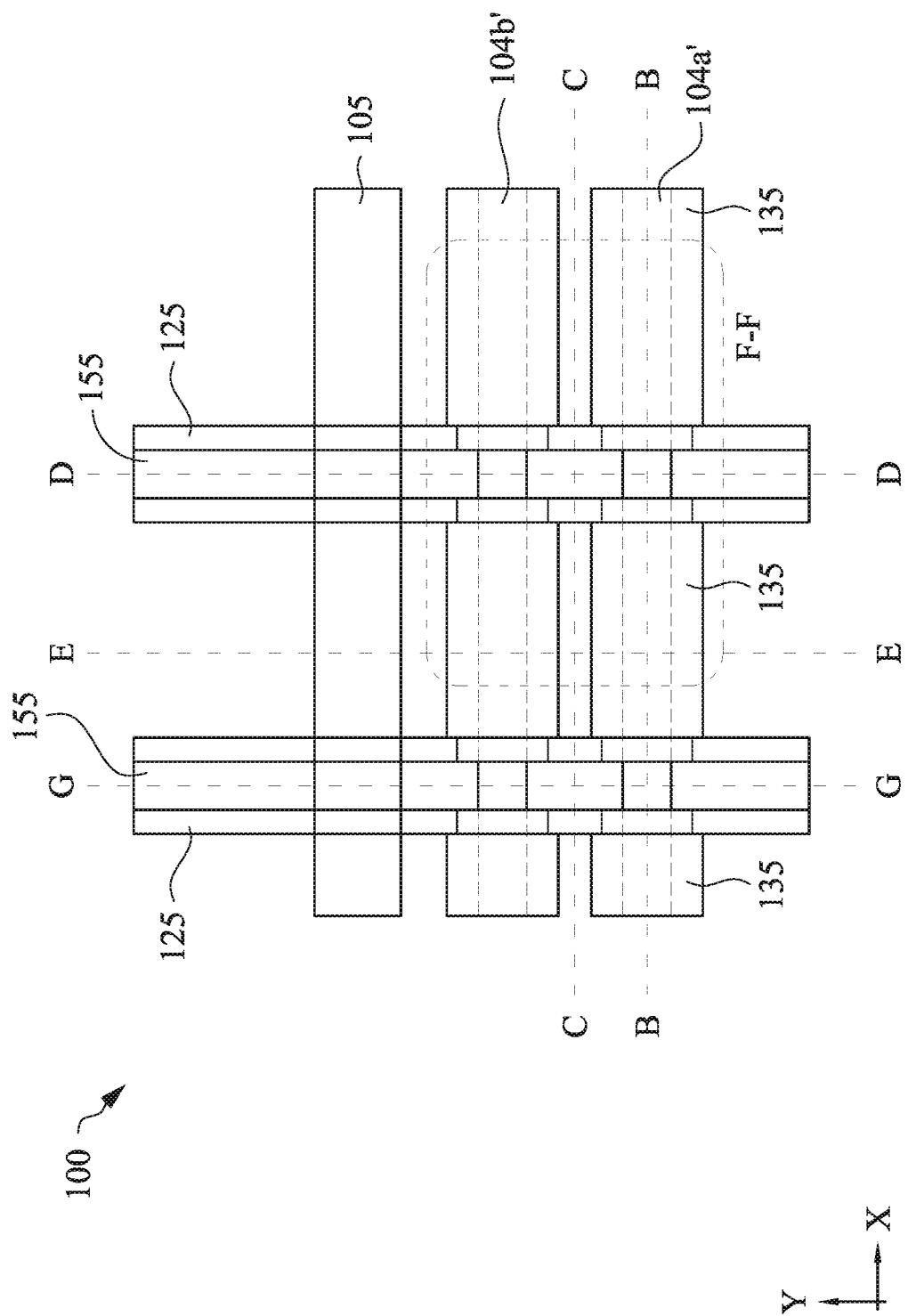
Figure 10E:
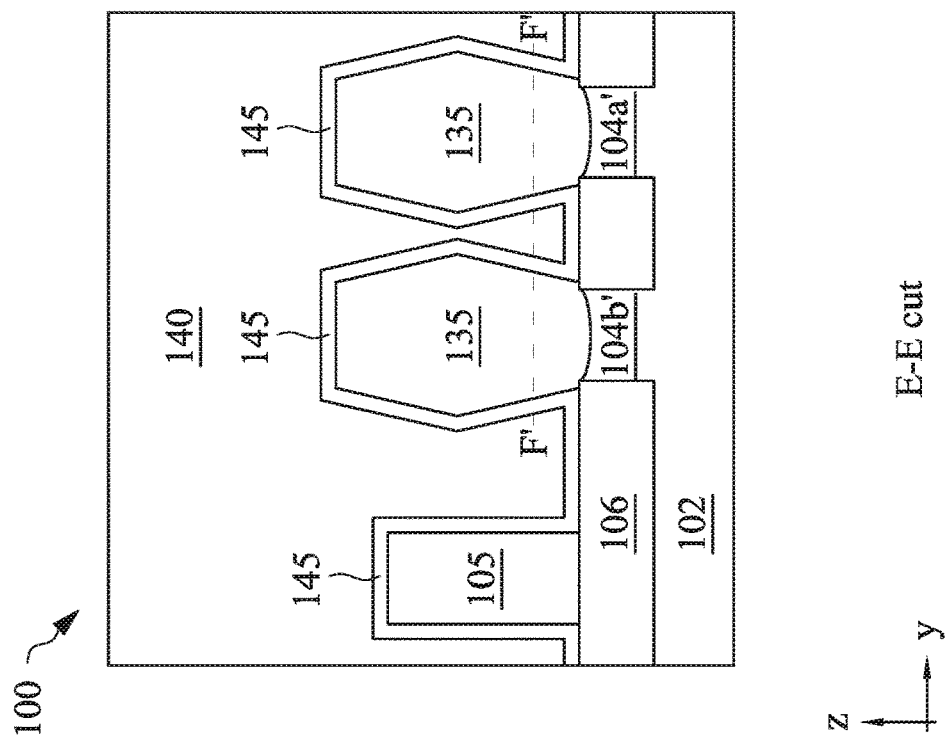
Figure 10D:
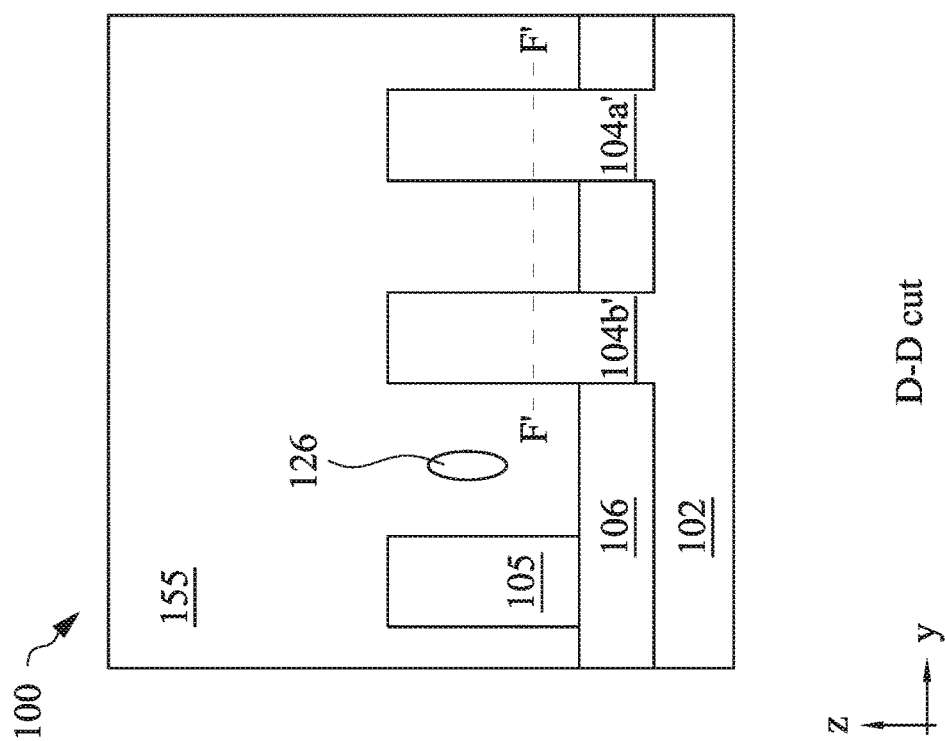
Figure 10F:
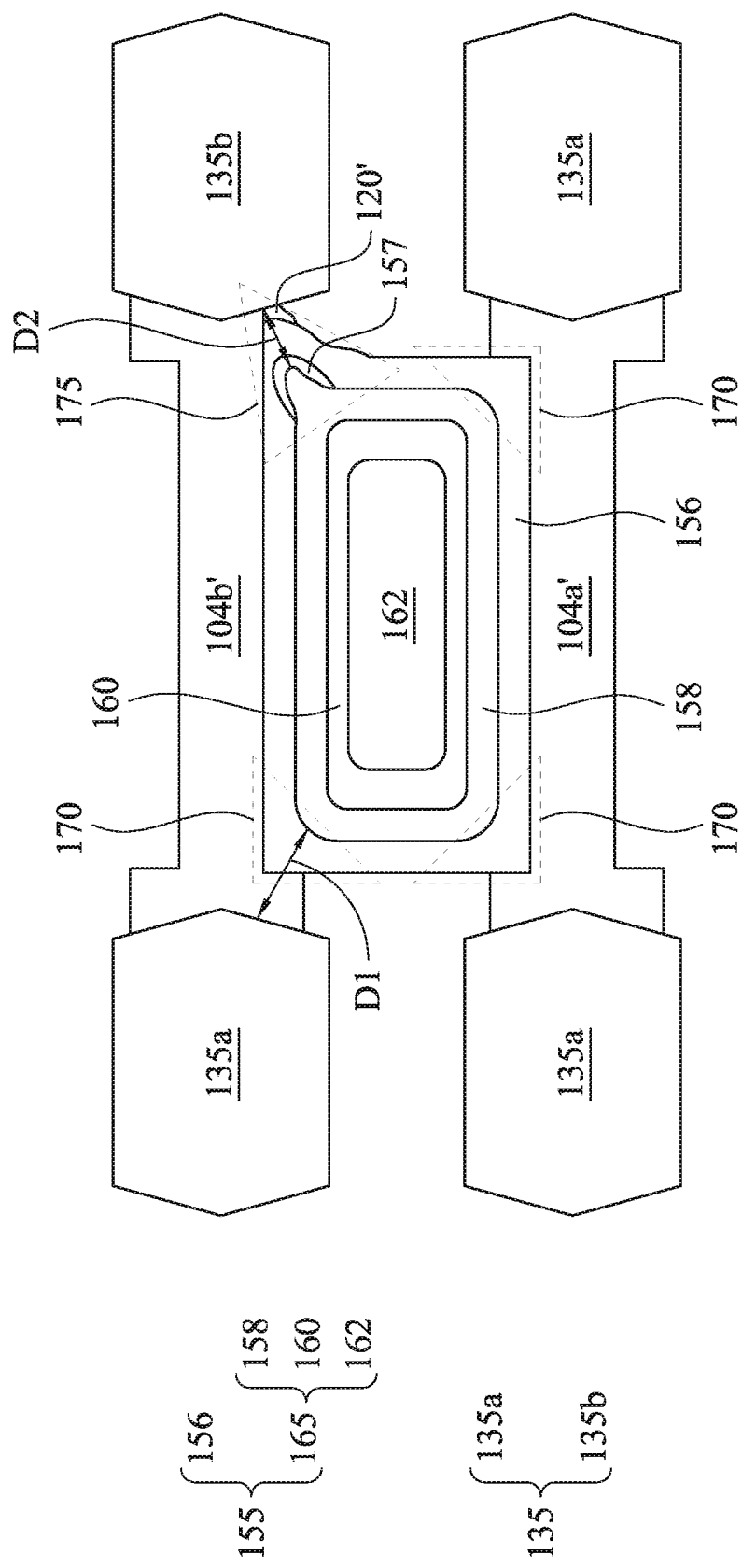
FIG. 10F illustrates a fragmentary cross-sectional view of the workpiece during a fabrication stage in the method of FIG. 1 in region F-F of FIG. 10A and along line F'-F' of FIGS. 10B, 10C, 10D, and 10E, according to various aspects of the present disclosure.

With reference to FIGS. 10A-10F, the metal gate structures 155 are deposited in the gate trenches 150. FIG. 10A depicts a fragmentary top view of the workpiece 100, FIGS. 10B-10E illustrate fragmentary cross-sectional views of the workpiece 100 taken along lines B-B, C-C, D-D, and E-E as shown in FIG. 10A, respectively. FIG. 10F illustrates a fragmentary cross-sectional view of the workpiece 100 in region F-F and taken along line F'-F' of FIGS. 10A and 10B, respectively. Line F'-F' is slightly above the top surface of the isolation structure 106, such that any remaining footing portion in the region F-F may be reflected in the cross-sectional view of FIG. 10F.

In some embodiments, the gate structures 155 track the shape of the trenches 150. The gate structures 155 may have uneven bottom surfaces. In embodiments, the gate structures 155 include a central portion 155c along the central line (e.g., line G-G) along the Y direction and two side portions 155a on two sides of the central portion 155c. The central portion 155c has a bottom surface lower than that of the two side portions 155a. In some embodiments, the gate structures 155 interface the bump 126.

In some embodiments, the gate structures 155 include a high-k dielectric layer 156 and a gate electrode 165 as shown in FIG. 10F. The high-k dielectric layer 156 is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, alumina ($Al_2O_3$), lanthanum oxide, yttrium oxide, strontium titanate, combinations thereof, or other suitable materials. The high-k dielectric layer 156 may be deposited using CVD, ALD and/or other suitable methods. The gate electrode 165 may include one or more work function layers 158 and 160 and a metal fill layer 162. The one or more work function layers 158 and 160 may include a p-type or an n-type work function layer depending on the type (PFET or NFET) of the device. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer 162 may be formed of a metal, such as tungsten (W), ruthenium (Ru), cobalt (Co) or copper (Cu). The gate electrode 165 may be deposited using methods such as CVD, PVD, plating, and/or other suitable processes. In some embodiments, the gate structures 155 further include an interfacial layer (not depicted), which may include a dielectric material such as silicon oxide layer. The interfacial layer may be formed using chemical oxidation, thermal oxidation, ALD, CVD, and/or other suitable methods.

Referring to FIG. 10F, in some embodiments, the oxidized footing portions 120' are removed from the dummy gate structure 130 in the steps of block 16. The replacement metal gate structure 155 tracks the shape and/or profile of the dummy gate structure 130 and thus has corners without footing effect, such as clean corners 170. In some other embodiments, a portion of the oxidized footing portions 120' remains through the processes. In such embodiments, the metal gate structure 155 includes a footing corner 175 extending toward the remaining oxidized footing portions 120'. A gap 157 may be formed in the metal gate structures 155. The gap 157 may be between the high-k dielectric layer 156 and the gate electrode 165. The gap 157 may include air. Although three clean corners 170 and one footing corner 175 are depicted, it is understood that the metal gate structures 155 may include at least one clean corner 170 and any number of the footing corners 175. In some embodiments, one metal gate structure 155 includes four clean corners 170 and no footing corner 175. The source/drain features 135 may include source/drain feature(s) 135a adjacent to the clean corner(s) 170 and source/drain feature(s) 135b adjacent to the footing corner(s) 175 as depicted. A distance D1 between the gate electrode 165 at a clean corner 170 and the adjacent source/drain feature 135a is greater than a distance D2 between the gate electrode 165 at a footing corner 175 and the adjacent source/drain feature 135b. Therefore, electrical short between the gate electrode 165 at the clean corner 170 and the adjacent source/drain feature 135a may be avoided. In addition, the metal gate structures 155 having the clean corner(s) 170 may improve many operating parameters of the semiconductor structure 100, such as speed performance and power consumption.

Referring to FIG. 1, method 10 includes a block 28 where further processes are performed to complete the fabrication of the workpiece 100. For example, subsequent processing may form contact openings, contact metal, as well as various contacts/vias/lines and multilayer interconnect features (e.g., metal layers and interlayer dielectrics), configured to connect the various features to form a functional circuit that may include one or more multi-gate devices. The various interconnection features may employ various conductive materials including copper, tungsten, and/or silicide. In one example, a damascene and/or dual damascene process is used to form a copper related multilayer interconnection structure.

One of ordinary skill may recognize although FIGS. 2-10F illustrate FinFET devices as embodiments, other examples of semiconductor devices may benefit from aspects of the present disclosure, such as GAA devices.

Although not intended to be limiting, one or more embodiments of the present disclosure provide many benefits to a semiconductor device and the formation thereof. For example, embodiments of the present disclosure avoid electrical short in the device, reduce short channel effects (SCEs), and improve operating parameters of the device by reducing and/or eliminating footing portions of dummy gate structures. In addition, embodiments of the present disclosure increase current driving capability by vertically and horizontally enlarging fins uncovered by the dummy gate structures in the manufacturing of the device. Further, overall performance of the device may be improved by reducing dimensions and/or eliminating voids in the dummy gate structures in the methods disclosed herein.

In one exemplary aspect, the present disclosure is directed to a method of making a semiconductor structure. The method includes providing a workpiece. The workpiece includes a substrate, a fin protruding from the substrate, and a dummy gate structure over the fin. The method further includes performing an oxidizing process to exposed surfaces of the fin and the dummy gate structure to form an oxide layer thereon; removing the oxide layer to expose an unoxidized top surface and sidewalls of the fin and unoxidized sidewalls of the dummy gate structure; epitaxially growing a cap layer on the unoxidized top surface and sidewalls of the fin and the unoxidized sidewalls of the dummy gate structure; forming a source/drain feature on the fin; and replacing the dummy gate structure with a metal gate structure. In some embodiments, the dummy gate structure includes a footing portion intersecting the fin, performing the oxidizing process includes oxidizing the footing portion, and removing the oxide layer includes removing the oxidized footing portion. In some embodiments, the oxide layer is a first oxide layer, the workpiece further includes a second oxide layer disposed on sidewalls of the fin, and removing the oxide layer includes removing the first oxide layer and a first portion of the second oxide layer uncovered by the dummy gate structure, such that a second portion of the second oxide layer directly under the dummy gate structure remains. In some embodiments, before performing the oxidizing process, the second oxide layer is further disposed on a top surface of the fin. The second oxide layer has a first thickness on the sidewalls of the fin and having a second thickness on the top surface of the fin. The cap layer on the unoxidized sidewalls of the fin has a thickness equal to or greater than the first thickness, and the cap layer on the unoxidized top surface of the fin has a thickness greater than the second thickness. In some embodiments, the dummy gate structure includes a void, the exposed surfaces of the fin and the dummy gate structure include an exposed surface of the void, removing the oxide layer further exposes an unoxidized surface of the void, and epitaxially growing the cap layer includes epitaxially growing the cap layer on the unoxidized surface of the void. In some embodiments, after epitaxially growing the cap layer, the void has a size smaller than that before performing the oxidizing process. In some embodiments, the workpiece further includes a dielectric fin over the substrate and adjacent to the fin, and the void is disposed between the fin and the dielectric fin. In some embodiments, before forming the source/drain feature on the fin, the method further includes forming gate spacers on the cap layer that is on the unoxidized sidewalls of the dummy gate structure. In some embodiments, the cap layer includes a same composition as the fin. In some embodiments, epitaxially growing the cap layer on the unoxidized top surface of the fin is at a first rate, and epitaxially growing the cap layer on the unoxidized sidewalls of the fin and the dummy gate structure is at a second rate less than the first rate.

In another exemplary aspect, the present disclosure is directed to a method of making a semiconductor structure. The method includes providing a workpiece. The workpiece includes a fin over a substrate, a first oxide layer disposed over sidewalls of the fin, and a dummy gate structure over the fin and directly above a first portion of the first oxide layer. The first oxide layer further includes a second portion uncovered by the dummy gate structure. The method further includes oxidizing exposed surfaces of the fin and the dummy gate structure to form a second oxide layer; removing the second portion of the first oxide layer and the second oxide layer, thereby exposing unoxidized surfaces of the fin and the dummy gate structure; and forming an epitaxial layer on the unoxidized surfaces of the fin and the dummy gate structure. The epitaxial layer has a thickness equal to or greater than the second oxide layer. In some embodiments, the method further includes forming gate spacers on the epitaxial layer that is on the unoxidized surfaces of the dummy gate structure; forming a source/drain feature on the fin; and replacing the dummy gate structure with a metal gate structure. In some embodiments, the workpiece further includes an isolation feature adjacent to the fin and under the dummy gate structure, the dummy gate structure includes a footing portion intersecting the fin and the isolation feature, and oxidizing the exposed surfaces of the fin and the dummy gate structure includes oxidizing the footing portion to form a portion of the second oxide layer. In some embodiments, the exposed surfaces of the fin and the dummy gate structure includes a top surface of the fin. In some embodiments, the method further includes performing an annealing process to the workpiece after forming the epitaxial layer. In some embodiments, the first portion of the first oxide layer is further disposed on a top surface of the fin, a top surface of the epitaxial layer on the fin is higher than a top surface of the first oxide layer.

In yet another exemplary aspect, the present disclosure is directed to a semiconductor structure. The semiconductor structure includes a substrate; a fin over the substrate and extending lengthwise along a first direction; a gate structure over the fin and extending lengthwise along a second direction perpendicular to the first direction; and gate spacers on sidewalls of the gate structure. The fin has a first portion directly under the gate structure and a second portion directly under the gate spacers, and the second portion has a width greater than a width of the first portion along the second direction. In some embodiments, the second portion of the fin has a height equal to or greater than a height of the first portion of the fin. In some embodiments, a portion of the gate spacers protrudes into the gate structure. In some embodiments, the first portion of the fin includes two first sub-portions adjacent to the second portion of the fin and a second sub-portion interposed between the two first sub-portions along the first direction, and the two first sub-portions have a top surface higher than a top surface of the second sub-portion.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a workpiece including:
      a substrate,
      a fin protruding from the substrate, and
      a dummy gate structure over the fin;
   performing an oxidizing process to exposed surfaces of the fin and the dummy gate structure to form an oxide layer thereon;
   removing the oxide layer to expose an unoxidized top surface and sidewalls of the fin and unoxidized sidewalls of the dummy gate structure;
   epitaxially growing a cap layer on the unoxidized top surface and sidewalls of the fin and the unoxidized sidewalls of the dummy gate structure;
   forming a source/drain feature on the fin; and
   replacing the dummy gate structure with a metal gate structure.

2. The method of claim 1, wherein the dummy gate structure includes a footing portion intersecting the fin,
   wherein performing the oxidizing process includes oxidizing the footing portion, and
   wherein removing the oxide layer includes removing the oxidized footing portion.

3. The method of claim 1, wherein the oxide layer is a first oxide layer,
   wherein the workpiece further includes a second oxide layer disposed on sidewalls of the fin, and
   wherein removing the oxide layer includes removing the first oxide layer and a first portion of the second oxide layer uncovered by the dummy gate structure, such that a second portion of the second oxide layer directly under the dummy gate structure remains.

4. The method of claim 3, wherein before performing the oxidizing process, the second oxide layer is further disposed on a top surface of the fin, the second oxide layer having a first thickness on the sidewalls of the fin and having a second thickness on the top surface of the fin,
   wherein the cap layer on the unoxidized sidewalls of the fin has a thickness equal to or greater than the first thickness, and
   wherein the cap layer on the unoxidized top surface of the fin has a thickness greater than the second thickness.

5. The method of claim 1, wherein the dummy gate structure includes a void,
   wherein the exposed surfaces of the fin and the dummy gate structure include an exposed surface of the void,
   wherein removing the oxide layer further exposes an unoxidized surface of the void, and
   wherein epitaxially growing the cap layer includes epitaxially growing the cap layer on the unoxidized surface of the void.

6. The method of claim 5, wherein after epitaxially growing the cap layer, the void has a size smaller than that before performing the oxidizing process.

7. The method of claim 5, wherein the workpiece further includes a dielectric fin over the substrate and adjacent to the fin, and
   wherein the void is disposed between the fin and the dielectric fin.

8. The method of claim 1, before forming the source/drain feature on the fin, the method further comprises:
   forming gate spacers on the cap layer that is on the unoxidized sidewalls of the dummy gate structure.

9. The method of claim 1, wherein the cap layer includes a same composition as the fin.

10. The method of claim 1, wherein epitaxially growing the cap layer on the unoxidized top surface of the fin is at a first rate, and
    wherein epitaxially growing the cap layer on the unoxidized sidewalls of the fin and the dummy gate structure is at a second rate less than the first rate.

11. A method, comprising:
    providing a workpiece including:
       a fin over a substrate,
       a first oxide layer disposed over sidewalls of the fin, and
       a dummy gate structure over the fin and directly above a first portion of the first oxide layer,
       wherein the first oxide layer further includes a second portion uncovered by the dummy gate structure;
    oxidizing exposed surfaces of the fin and the dummy gate structure to form a second oxide layer;
    removing the second portion of the first oxide layer and the second oxide layer, thereby exposing unoxidized surfaces of the fin and the dummy gate structure;
    forming an epitaxial layer on the unoxidized surfaces of the fin and the dummy gate structure;
    forming source/drain features on the fin; and
    replacing the dummy gate structure with a metal gate structure,
    wherein the epitaxial layer has a thickness equal to or greater than the second oxide layer.

12. The method of claim 11, further comprising:
    forming gate spacers on the epitaxial layer that is on the unoxidized surfaces of the dummy gate structure.

13. The method of claim 11, wherein the workpiece further includes an isolation feature adjacent to the fin and under the dummy gate structure,
    wherein the dummy gate structure includes a footing portion intersecting the fin and the isolation feature, and
    wherein oxidizing the exposed surfaces of the fin and the dummy gate structure includes oxidizing the footing portion to form a portion of the second oxide layer.

14. The method of claim 11, wherein the exposed surfaces of the fin and the dummy gate structure includes a top surface of the fin.

15. The method of claim 11, further comprising: performing an annealing process to the workpiece after forming the epitaxial layer.

16. The method of claim 11, wherein the first portion of the first oxide layer is further disposed on a top surface of the fin,
    wherein a top surface of the epitaxial layer on the fin is higher than a top surface of the first oxide layer.

17. A method, comprising:
   providing a structure comprising:
      a semiconductor fin-shaped structure, and
      a dummy gate structure over a channel region of the semiconductor fin-shaped structure;
   performing an oxidizing process to surfaces of a source/drain region of the semiconductor fin-shaped structure and exposed surfaces of the dummy gate structure, thereby forming an oxide layer;
   removing the oxide layer;
   epitaxially growing an epitaxial layer from the semiconductor fin-shaped structure and the dummy gate structure;
   recessing the epitaxial layer and the semiconductor fin-shaped structure in the source/drain region of the semiconductor fin-shaped structure;
   forming a source/drain feature in the source/drain region of the semiconductor fin-shaped structure;
   removing the dummy gate structure to form a gate trench; and
   forming a metal gate structure in the gate trench.

18. The method of claim 17, further comprising forming a gate spacer on a sidewall of the epitaxial layer over the dummy gate structure.

19. The method of claim 17, wherein before performing the oxidizing process, the surfaces of a source/drain region of the semiconductor fin-shaped structure comprises a dent, and
   wherein the oxide layer is formed in the dent.

20. The method of claim 17, wherein removing the oxide layer comprises performing a wet etching process.

* * * * *